(12) United States Patent
Lin et al.

(10) Patent No.: US 11,723,194 B2
(45) Date of Patent: Aug. 8, 2023

(54) INTEGRATED CIRCUIT READ ONLY MEMORY (ROM) STRUCTURE

(71) Applicant: TAIWAN SEMICONDUCTOR MANUFACTURING COMPANY, LTD., Hsinchu (TW)

(72) Inventors: Geng-Cing Lin, Hsinchu (TW); Ze-Sian Lu, Hsinchu (TW); Meng-Sheng Chang, Hsinchu (TW); Chia-En Huang, Hsinchu (TW); Jung-Ping Yang, Hsinchu (TW); Yen-Huei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/193,594

(22) Filed: Mar. 5, 2021

(65) Prior Publication Data

US 2022/0285375 A1    Sep. 8, 2022

(51) Int. Cl.
*H01L 27/112*   (2006.01)
*H10B 20/00*    (2023.01)
*H01L 21/265*   (2006.01)
*H01L 23/528*   (2006.01)

(52) U.S. Cl.
CPC ....... *H10B 20/34* (2023.02); *H01L 21/26513* (2013.01); *H01L 23/5286* (2013.01)

(58) Field of Classification Search
CPC ......... H01L 27/11226; H01L 21/26513; H01L 23/5286; H01L 27/112; H01L 27/11206; H01L 27/11213; H01L 27/1122; H10B 20/00; H10B 20/20; H10B 20/25; H10B 20/27; H10B 20/34; H10B 20/30
See application file for complete search history.

(56) References Cited

U.S. PATENT DOCUMENTS

| | | | |
|---|---|---|---|
| 7,260,442 B2 | 8/2007 | Hwang et al. | |
| 8,995,164 B2 | 5/2015 | Clinton | |
| 9,256,709 B2 | 2/2016 | Yu et al. | |
| 9,825,055 B2* | 11/2017 | Zhang | H01L 21/823821 |
| 2007/0047301 A1* | 3/2007 | Aritome | H01L 27/115 257/E21.679 |
| 2012/0001232 A1* | 1/2012 | Liaw | H01L 27/0207 257/E27.059 |
| 2012/0002477 A1* | 1/2012 | Tang | H01L 27/11551 438/257 |
| 2014/0040838 A1 | 2/2014 | Liu et al. | |
| 2015/0235948 A1 | 8/2015 | Song et al. | |
| 2015/0278429 A1 | 10/2015 | Chang | |

(Continued)

*Primary Examiner* — Eduardo A Rodela
(74) *Attorney, Agent, or Firm* — Hauptman Ham, LLP

(57) ABSTRACT

An integrated circuit read only memory (ROM) structure includes a first ROM transistor with a first gate electrode, a first source, and a first drain, and a second ROM transistor with a second gate electrode, a second source, and a second drain. A drain conductive line is over the first drain and the second drain, and is between the first drain and the second drain. The first drain, the drain conductive line and the second drain are between the first gate electrode and the second gate electrode, and a first trench isolation structure electrically isolates the first drain from the first source is below the first gate electrode.

20 Claims, 23 Drawing Sheets

(56) References Cited

U.S. PATENT DOCUMENTS

2015/0311122 A1* 10/2015 Rashed ........... H01L 21/823475
                                                      438/283
2017/0133365 A1* 5/2017 Lim ..................... H01L 23/528
2018/0053832 A1   2/2018 Beyer et al.
2018/0122930 A1   5/2018 Okamoto et al.
2019/0237542 A1* 8/2019 Chen .................. H01L 29/6656
2020/0402979 A1* 12/2020 Chien .................. H01L 21/765

* cited by examiner

INTEGRATED CIRCUIT READ ONLY MEMORY (ROM) STRUCTURE

BACKGROUND

Some integrated circuits include random access memory (RAM) or read-only memory (ROM) structures which store information for the operation of a computing device. RAM structures are configured to receive, store, and deliver information during the operation of a computing device which changes during device operation. ROM structures are configured to provide fixed information to the computing device which does not change during device operation.

ROM structures include structures which are configured in hardware at the time of an integrated circuit being manufactured. Erasable programmable read only memory (EPROM) and electrically erasable programmable read only memory (EEPROM) are able to be erased and re-programmed, but at low speeds, and for a low number of reprogramming sessions.

ROM structures include combinations of logic gates (transistors) which are joined to map n-bit address input into data output. ROM structures are read by using word lines to regulate the address input, and bit lines to receive data output from the transistors of the ROM. ROM structures are non-volatile because the ROM structures retain the programmed information even when the power to the ROM structure is removed.

DETAILED DESCRIPTION

Figure 1:
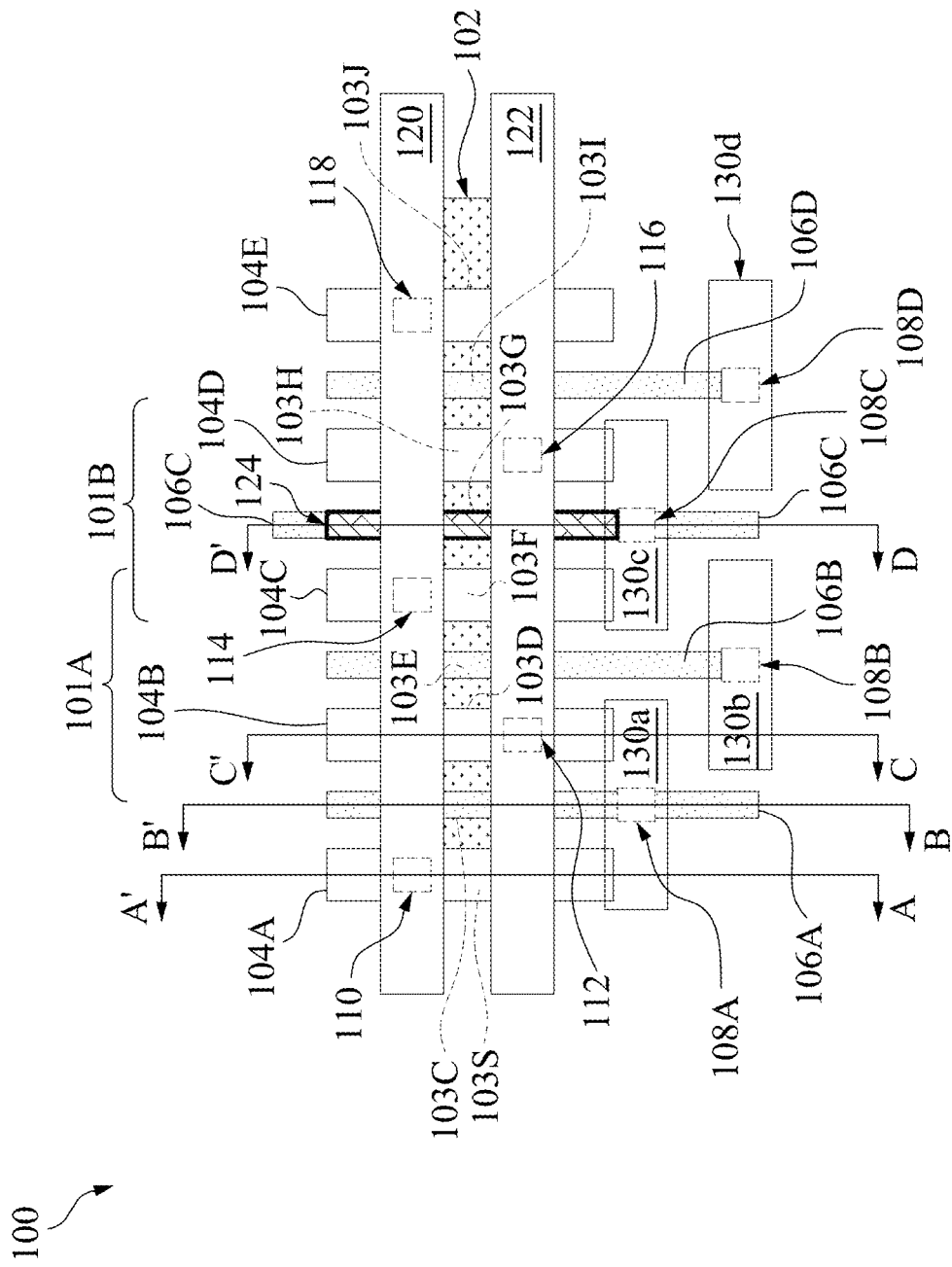
FIG. 1 is a top view of an integrated circuit read only memory (ROM) structure, in accordance with some embodiments.

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Read only memory (ROM) structures are used in integrated circuits to store information which is changed infrequently, or not at all, during the operation of a device in which the ROM is installed. In some instances, ROM structures are configured in hardware, where the information stored therein (the stored information pattern) is hard-coded into the structure of the transistors or logic gates of the ROM structure. Thus, configured-in-hardware ROM structures are non-volatile, in that the stored information remains in the ROM structure even when no power is supplied to the ROM structure. ROM structures are used to store information related to, e.g., the low-level operational characteristics of a computing device. Some examples of low-level operational characteristics include data communication, boot-up operations, and the like.

In some embodiments, configured-in-hardware ROM structures use word-line programming, where the structure of the transistor is configured to produce, based on a word-line input, either a "0" (e.g., no voltage, or no output signal from the transistor) or a "1" (a measurable voltage, or output signal from the transistor) result when the word line input is received at the transistor. Hardware-configured ROM structures, or word-line programming, as described herein, are compatible with fixed-content ROMs, rather than reprogrammable ROMs. Embodiments of the present disclosure relate to a method of making a ROM structure with reduced bit-line capacitance as compared to other ROM structures which are free of trench isolation structures. Other ROM structures include an array of poly lines in which a ROM transistor shares a source or drain with an adjacent ROM transistor. In some embodiments, a ROM structure having an array of poly lines for gate electrodes and source/drain conductive lines has a smaller cell area than ROM structures which use dummy lines between adjacent ROM transistors because some of the poly lines are shared by two adjacent ROM transistors. In some embodiments, the amount of cell area reduction is about 30% based on the sharing of a conductive line for a source/drain region by two adjacent ROM transistors.

FIG. 1 is a top view of an integrated circuit read only memory (ROM) structure 100, in accordance with some embodiments. ROM structure 100 includes an active area 102. In the ROM structure 100, a transistor conductive path includes parts of an active area which conduct electrical current between the source contact and drain contact of the ROM structure. In some embodiments, a ROM structure transistor conductive path is a fin of a FinFET having therein a source region, a drain region, and a channel between the source region and the drain region. In some embodiments, a transistor conductive region is part of an active area of an integrated circuit. In some embodiments, an active area of an integrated circuit includes multiple transistor conductive paths (e.g., one active area includes multiple FinFET fins, each fin having a source region, a drain region, and a channel therebetween). In some embodiments, the source region, the drain region, and the channel are fins of semiconductor material, with a same material below the source region, the drain region, and the channel. In some embodiments, the source region, the drain region, and the channel are a layer of material deposited onto a substrate material different from the material of the source region, the drain region, and the channel.

Active area 102 includes a channel 103C under gate electrode 106 which is capable of carrying current, or charge carriers, between a source region 103S under conductive line 104A and a drain region 103D under conductive line 104B of the ROM structure 100. In some embodiments, channel 103C of active area 102 is patterned to define one or more fins of a semiconductor material for a fin field effect transistor (FinFET) device, where the gate electrode is against three sides of the channel 103C. In some embodiments, the active area 102 is patterned to define a plurality of nanowires for a gate-all-around (GAA) type of transistor, where the gate electrode is against four sides (e.g., all around) the channel. Other types of channels and active areas are also envisioned within the scope of the present disclosure.

In some embodiments, the channel of active area 102 is a semiconductor material, such as an intrinsic semiconductor, a type III-V semiconductor, and so forth. In some embodiments, the active area 102 includes silicon, silicon germanium, and so forth. In some embodiments, the channel includes a layer of semiconductor material over an insulator material (e.g., a silicon-on-insulator (SOI) structure). In some embodiments, the layer of semiconductor material is etched to form fins, and the space between the fins is filled with an insulating material to electrically isolate the lower portion of the fins from each other. In some embodiments, sections of an upper portion of the fins are doped to form source/drain regions of the ROM structure transistors and/or LDD regions of the transistor near the channel of the ROM structure.

ROM structure 100 includes a set of conductive lines 104A-104E over the top of the active area 102. Conductive lines 104A, 104C, and 104E are source conductive lines, which are electrically connected to the Vss power rail 120. Conductive lines 104B and 104D are drain conductive lines, which are electrically connected to the bit line (BL) 122.

ROM structure 100 includes a set of gate electrodes 106A, 106B, 106C, and 106D which are over the active area 102. Gate electrode 106A is between source contact 104A and drain electrode 104B. Gate electrode 106B is between conductive line (source line) 104C and conducive line (drain line) 104B. Gate electrode 106D is between conductive line (source line) 104E and conductive line (drain line) 104D. Gate electrode 106C is between conductive line (source line) 104C and conductive line (drain line) 104D. Gate electrode 106C is partially replaced by a trench isolation structure 124. Trench isolation structure 124 includes a dielectric material which fills a trench or opening etched into the active area 102. Trench isolation structure 124 electrically isolates portions of the active area on opposite sides of the trench isolation structure 124 from each other.

Trench isolation structure 124 is located between conductive lines 104C and 104D. Trench isolation structure extends through active area 102. ROM structure 100 includes a set of source regions 103S, 103F, and 103J. ROM structure 100 includes a set of drain regions 103D and 103H. ROM structure includes a set of channels 103C, 103E, 103I. Region 103G corresponds to a first position in active area 102 where a channel is replaced by trench isolation structure 124. First ROM cell 101A includes gate electrode 106B over channel 103E, drain 103D, drain conductive line 104B, source 103F, and source conductive line 104C. Second ROM cell 101B includes source 103F, source conductive line 104C, gate electrode 106C, trench isolation structure 124, drain 103H, and drain conductive line 104D. First ROM cell 101A is configured, or hardware configured, to provide a "1" bit as output when a voltage is applied to gate electrode 106B. The "1" bit output from first ROM cell 101A is read through the source contact 114 electrically connected to source conductive line 104C. Second ROM cell 101B is configured, or hardware configured, to provide a "0" bit output when a voltage is applied to gate electrode 106C, because trench isolation structure 124 electrically isolates source 103F from drain 103H.

Word line 130a is electrically connected to gate electrode 106A by gate electrode contact 108A. Gate electrode 106B is electrically connected to word line 130b by gate electrode contact 108B. Gate electrode 106C is electrically connected to word line 130c by gate electrode contact 108C. Gate electrode 106D is electrically connected to word line 130d by gate electrode contact 108D.

Vss power rail 120 is electrically connected to conductive line 104A by source contact 110, to conductive line 104C by source contact 114, and to conductive line 104E by source contact 118. The Vss power rail 120 is tied to ground in the integrated circuit having ROM structure 100, and provides a current path for the carriers flowing through the active area 102. Bit line 122 is electrically connected to conductive line 104B by drain contact 112, and to conductive line 104D by drain contact 116. In ROM structure 100, Vss power rail 120 and bit line 122 are shown extending continuously over active area 102 between conductive lines 104A and 104E. In some embodiments of ROM cells, the Vss power rail and the bit line are divided into portions between conductive lines against the active area by dielectric material deposited between the portions. In some embodiments, the Vss power rail and the bit line of a ROM structure are divided into portions by a trench isolation structure (see, e.g., trench isolation structure 124 of FIG. 1).

Figure 2:
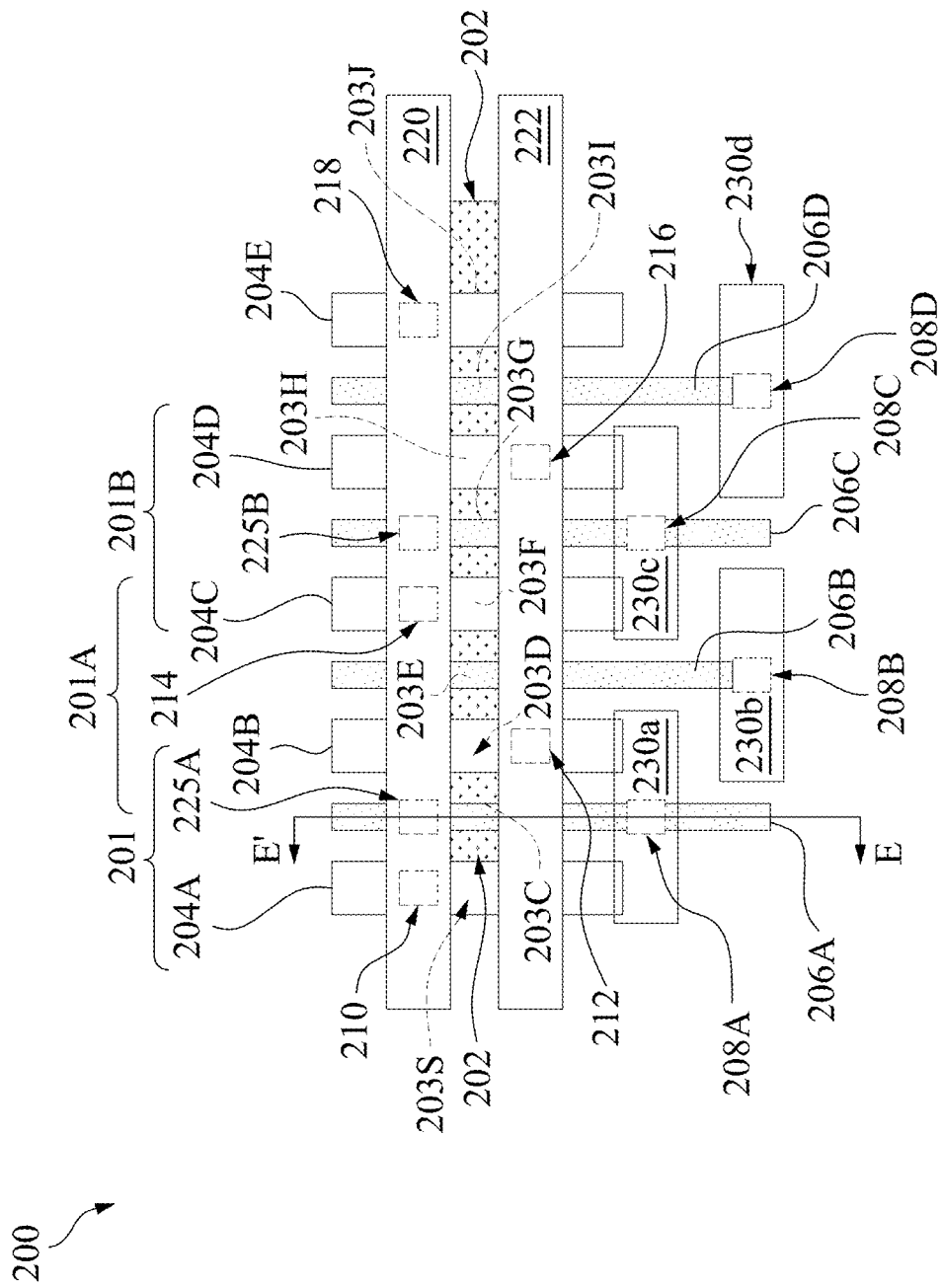
FIG. 2 is a top view of an integrated circuit ROM structure, in accordance with some embodiments.

FIG. 2 is an integrated circuit ROM structure 200, in accordance with some embodiments. Elements of ROM structure 200 which have a similar function as elements of ROM structure 100 have a same identifying numeral, increased by 100. Differences between ROM structure 100 and ROM structure 200 are described below. ROM structure 200 does not include a trench isolation structure (i.e., ROM structure 200 is free of trench isolation structure 124 of FIG. 1). Rather, ROM structure includes gate electrode tie-off contacts 225A and 225B. A gate electrode tie-off contact is a contact which electrically connects a gate electrode to a Vss power rail of a ROM structure to permanently short the gate electrode to the source, forcing the ROM output of the tied-off gate electrode to be a "0" bit. In a non-limiting example, in first ROM cell 201, gate electrode tie-off contact 225A electrically connects gate electrode 206A to Vss power rail 220. First ROM cell 201 includes source 203S, channel 203C, and drain 203D. Source 203S is electrically connected to source conductive line 204A, channel 203C is in proximity to gate electrode 206A, and drain 203D is electrically connected to drain conductive line 204B. Second ROM cell 201A includes drain 203D, channel 203E, and source 203F. Second ROM cell 201A includes gate electrode 206B, drain conductive line 204B, and source conductive line 204C. Third ROM cell 201B includes source 203F, channel 203G, and drain 203H. Third ROM cell 201B includes source conductive line 204C, gate electrode 206C, and drain conductive line 204D. Third ROM cell 201B also includes gate electrode tie-off contact 225B which electrically connects gate electrode 206C to Vss power rail 220. Thus, in first ROM cell 201, gate electrode 206A is programmed to provide a "0" bit output when a voltage is applied to gate electrode 206A. In second ROM cell 201A, gate electrode 206B is configured to provide a "1" bit out when a voltage is applied to gate electrode 206B from, e.g., word line 230b and contact 208B/Third ROM cell 201B is configured to provide a "0" bit output when a voltage is applied to gate electrode 206C. ROM cells with gate electrode tie-off contacts provide a "0" bit result because the voltage applied to the gate electrode from the word line is shorted to the Vss power rail. ROM cells with no gate electrode tie-off contacts electrically connected to the gate electrode apply a voltage to the channel in proximity to the gate electrode, and a "1" bit result is read from the ROM cell.

In ROM structure 100, bit line 122 is between the Vss power rail 120 and the word lines 130a-130d. In ROM structure 200, the bit line 222 is between the Vss power rail 220 and the word lines 230a-230d. In some embodiments, the word lines are between the Vss power rail and the bit line of the ROM cells. In some embodiments, the Vss power rail is between the word lines and the bit line of the ROM cells.

Active area 102 in ROM structure 100 has a lower leakage current than active area 202 in ROM structure 200 because the trench isolation structure 124 divides active area 102 into two portions, electrically isolating a source on one side of the trench isolation structure (see, e.g., the source (not labelled) under conductive line 104C) from the drain on the other side of the trench isolation structure (see, e.g., the drain (not labelled) under conductive line 104D). Manufacturing of a ROM structure having trench isolation structures therein provided lower leakage current but has greater manufacturing difficulty (and additional manufacturing steps) as compared to ROM structure 200. ROM structure 200 is hardware configured by forming additional contacts to a predetermined set of gate electrodes in a set of manufacturing steps already present in a manufacturing process for ROM structure 200, with no additional processing steps. The reduced manufacturing complexity of a ROM structure similar to ROM structure 200 reduces the overall time and cost of manufacturing an integrated circuit, and reduces the average number of defects in the ROM structure associated with the manufacturing process.

Figure 3:
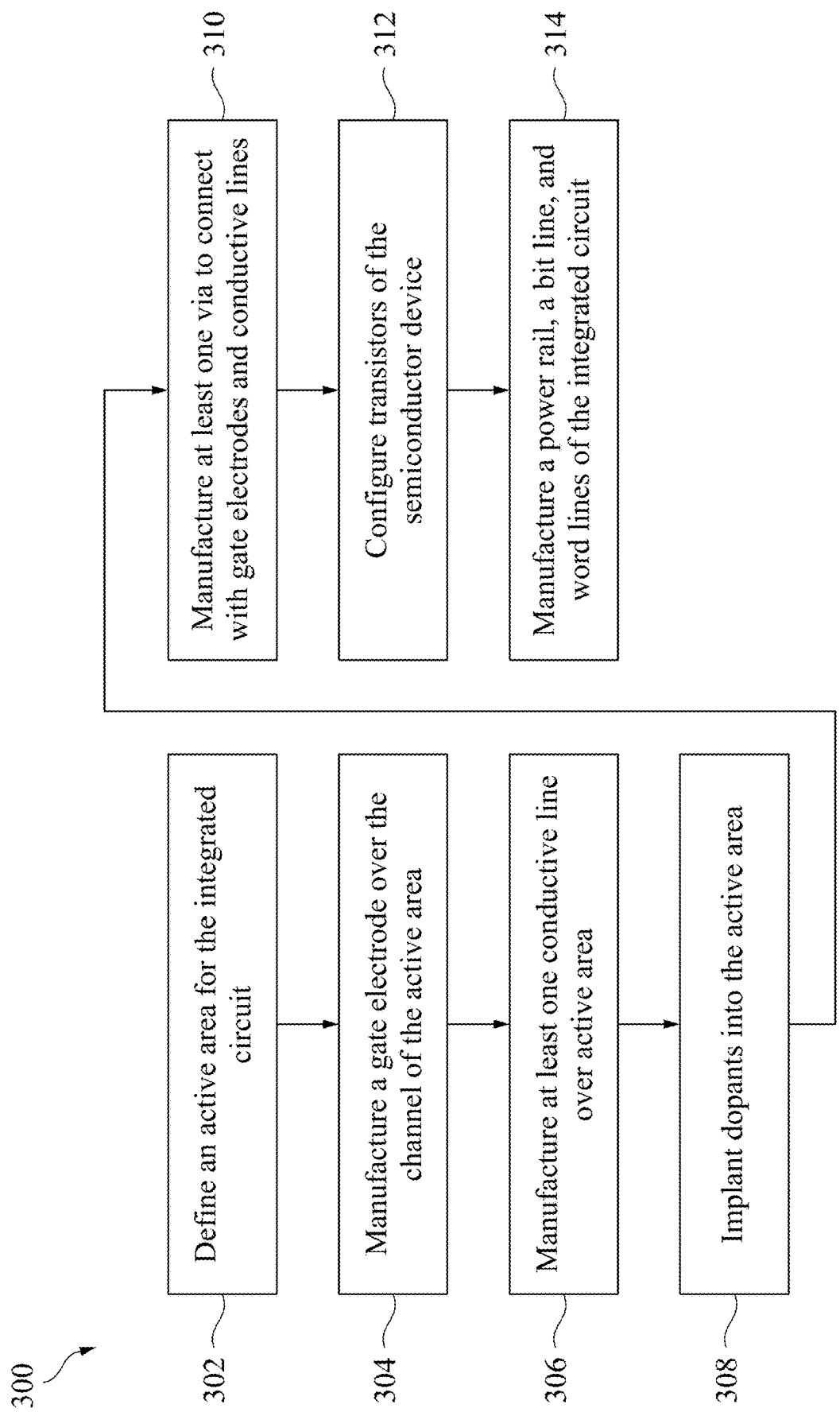
FIG. 3 is a flow diagram of a method of making an integrated circuit ROM structure, in accordance with some embodiments.

FIG. 3 is a flow diagram of a method 300 of making an integrated circuit ROM structure, in accordance with some embodiments. Method 300 includes a first operation 302, in which channel of an active area is defined. In some embodiments, the active area is over a substrate. In some embodiments, the active area is defined within the substrate. In some embodiments, a channel of the active area is patterned as a fin of a semiconductor material. In some embodiments, the channel of the active area is patterned as a nanowire of semiconducting material for a gate-all-around transistor. In some embodiments, the channel includes an intrinsic semiconductor such as intrinsic silicon. In some embodiments, the channel includes a type III-V semiconductor material. In some embodiments, the channel of the active area is formed over a layer of insulating material for, e.g., a silicon-on-insulator (SOI) transistor. According to some embodiments, the layer of semiconductor material is the same material as a wafer on which the integrated circuit containing the ROM structure is manufactured. In some embodiments, the layer of semiconductor material of the channel is deposited onto a substrate on which the integrated circuit containing the ROM structure is manufactured. In some embodiments, deposition of a layer of semiconductor material for the channel of the active area is performed by chemical vapor deposition onto a substrate using, e.g., silane ($SiH_4$) and/or ($GeH_4$), singly or in combination. The thickness of the layer of semiconductor material for the channel of the active area is dependent on the semiconductor design and the electrical characteristics of the source/drain and channel of the transistors of the ROM cells of the integrated circuit.

According to some embodiments, the active area is an undoped semiconductor material which is doped at a stage of the ROM structure manufacturing process after the gate electrode and/or conductive lines are manufactured over the channel. Details of the doping of an active area channel are described further in operation 308, below.

Method 300 includes an operation 304, in which at least one gate electrode is manufactured over the channel of the active area. In some embodiments, a gate electrode is deposited manufactured by depositing (e.g., depositing a gate electrode) multiple layers over the channel and etching the layers to form the gate electrode over the channel, but not over the source or drain regions. In some embodiments, a gate dielectric material is deposited over the channel, and a layer of conductive material is deposited over the channel. According to some embodiments, the gate dielectric material includes a layer of silicon dioxide. In some embodiments, the gate dielectric material includes a high-k dielectric material (e.g., a material having a dielectric constant greater than the dielectric constant of silicon dioxide). In some embodiments, a layer of dielectric material is deposited over the active area, and a trench is etched into the layer of dielectric material, to expose the channel, before the gate dielectric material and the layer of conductive material (for the gate electrode) are deposited over the channel (e.g., as part of a gate-last transistor manufacturing process, or a replacement gate process).

Method 300 includes an operation 306, in which conductive lines are manufactured over the source and drain regions of the transistor conductive path on either side of a channel of the active area. In some embodiments, the conducive lines are manufactured by depositing a layer of dielectric material over the channel, etching a series of trenches into the layer of dielectric material over the channel (exposing the channel), and filling the series of trenches with a conductive material directly against the channel. The conductive material acts as source or drain lines of the ROM cell being manufactured in the integrated circuit. In some embodiments, the conductive material is deposited as a blanket layer of material over the channel, and the blanket layer of conductive material is etched into a series of conductive lines with a patterned layer of patterning material (e.g., photoresist or some other patterning material). The layer of conductive material for conductive lines is deposited, by, e.g., chemical vapor deposition (CVD) such as high-pressure CVD, low-pressure CVD, plasma-enhanced CVD (PECVD), and so forth, or by atomic layer deposition (ALD) of the conductive material over the channel. In some embodiments, lines of conductive material are formed over the channel on either side of positions of gate electrodes of the ROM cells being manufactured for the integrated circuit. In some embodiments, a conductive line is a drain line which provides an electrical to two adjacent transistors of the ROM cell of the integrated circuit. In some embodiments, the conductive line is a source line which provides an output of a ROM cell of the integrated circuit, where the source line is shared by two gate electrodes, and the output through the source line depends on the hardware programming (e.g., the word line programming) of the gate electrode of a ROM cell.

Method 300 includes an operation 308, in which dopants are implanted into the transistor conductive path in an active area outside the channel, according to some embodiments. In some embodiments, the dopants are implanted to form source/drain regions of ROM cells of the integrated circuit. In some embodiments, the dopants are implanted to form LDD regions (a doped region in the source or drain region between a bulk portion of the source or drain region and a channel). In some embodiments, the LDD regions extend partially below the gate electrode/gate dielectric material in the active area. In some embodiments, dopants are implanted before the formation of conductive lines over the active area as described in operation 306. In some embodiments, the dopants are implanted after the formation of conductive lines over the active area as described in operation 306.

Method 300 includes an operation 310 in which at least one via is manufactured to connect with the gate electrode and the conductive lines of the integrated circuit ROM structure. According to some embodiments of method 300, a layer of semiconductor material is deposited over the material is deposited over the conductive lines and the gate electrodes to electrically isolate the gate electrodes from the conductive lines. A layer of patterning material is developed (by, e.g., photolithography or electron beam patterning) to have a set of openings directly over the conductive lines and/or gate electrodes of the ROM. The layer of dielectric material is etched through openings in the layer of patterning material to form contact or via openings. A conductive material is deposited into the openings in the layer of semiconductor material to form vias or contacts electrically connected to conductive lines and the gate electrodes of the ROM.

According to some embodiments, the pattern of openings in the layer of dielectric material has a single opening, corresponding to a single via or contact, to each conductive line or gate electrode of the ROM. In some embodiments, the pattern of openings in the layer of dielectric material has two openings (e.g., two contacts or vias) to the gate electrode of some transistors of the ROM, and 1 opening (e.g., one contact or via) to the gate electrode of some transistors of the ROM. A gate electrode having two contacts or vias is hardware configured (e.g., word-line programmed) to produce a "0" bit result when read, and a gate electrode having one contact or via is hardware configured (e.g., word-line programmed) to produce a "1" bit result when read.

In some embodiments, a gate electrode position of the ROM having a single opening thereto (or, a single contact or via thereto) has a trench isolation structure (as described below in operation 312) in place of the gate electrode for a ROM transistor, producing a "0" bit result when read. In some embodiments, a gate electrode position of the ROM having a single opening thereto (or, a single contact or via thereto) has no trench isolation structure (as described below in operation 312), such that the ROM transistor produces a "1" bit when read.

Method 300 includes an operation 312 wherein the ROM transistors are configured to produce a "0" or a "1" bit result according to some embodiments. In some embodiments, the configuration of ROM transistors by the replacement of part of a gate electrode with a trench isolation structure prevents a voltage from producing a "0" bit result when the ROM transistor is read. A trench isolation structure is used to configure a ROM transistor by performing a sequence of steps including [1] patterning the top surface of the integrated circuit, [2] etching the integrated circuit through openings in a layer of patterning material to form openings through parts of a gate electrode over a channel of the ROM transistor, and [3] filling the opening in the gate electrode (and, according to some embodiments, the underlying semiconducting material of the channel) with a dielectric material to electrically isolate the divided portions of the active area from each other. By electrically isolating the divided portions of the channel/active area from each other, the bit line capacitance is reduced and the ROM operates at higher switching speed than in embodiments where ROM transistors are not divided by a trench isolation structure (e.g., when the ROM transistors are separated by "dummy" conductive lines and/or gate electrodes (poly lines) not connected to the integrated circuit). The use of dummy conductive lines/gate electrodes to separate ROM transistors from each other in an integrated circuit reduces leakage current between ROM transistors. As transistor size is reduced, the leakage current increases and the power efficiency of the integrated circuit decreases. By providing a trench isolation structure across and through a channel/active area as part of word-line programming of a ROM transistor, the leakage current decreases and power efficiency of an integrated circuit increases, especially for small gate lengths, in comparison with other approaches.

In some embodiments, the ROM transistors are configured by the inclusion of gate electrode tie-off contacts over some, but not all, gate electrodes. In some embodiments, the configuration of ROM transistors is performed during the operation 310, when vias or contacts to the conductive lines and gate electrodes are manufactured in an integrated circuit. The presence of a gate electrode tie-off contact over a gate electrode short circuits the gate electrode to the Vss power rail (e.g., the current applied to the gate electrode from a word line/word line contact to the gate electrode) is immediately shunted to the Vss power rail by the gate electrode tie-off contact, "programming" the ROM transistor to force the ROM transistor to output a "0" bit when the ROM transistor is read. The absence of a gate electrode tie-off contact over a gate electrode forces the ROM transistor to output a "1" bit when the ROM transistor is read. Thus, hardware programming or word-line programming using the pattern of contacts in ROMs of an integrated circuit regulates the stored information provided by each transistor for a computing device to use during operation.

Method 300 includes an operation 314 in which a power rail (e.g., a Vss power rail, or a Vss rail), a bit line (bit line bar), and word lines are manufactured over the conductive lines, gate electrode(s), and the vias of the ROM transistor. Vss power rails and bit lines of an integrated circuit are manufactured by, e.g., depositing a layer of dielectric material (an inter-layer dielectric, or ILD) over the top of the vias formed in operation 310, etching trenches in the ILD to expose the top surfaces of the contacts, and filling the trenches in the ILD with a conductive material (e.g., polysilicon or a metal or metal alloy) to form conductive lines extending across the tops of ROM transistors to provide a voltage to trigger the ROM reading process, or to receive the ROM transistor output during a ROM reading process. In some embodiments, the power rail, the bit line, and the word lines are manufactured in a same series of steps (e.g., steps of [1] depositing a layer of patterning material over the ILD, [2] developing the patterning layer, [3] etching the ILD to form a set of trenches in the ILD to expose the top surfaces of contacts to the conductive lines and gate electrodes, [4] and filling the trenches for the conductive lines with a conductive material (e.g., polysilicon, metal, or a metal alloy)). In some embodiments, the Vss power rail and the bit line are formed in one set of steps, and the word lines are formed in a different set of steps.

In some embodiments of operation 314, the word lines are manufactured in continuous portions which extend across multiple conductive lines of a ROM transistor, or multiple ROM transistors. In some embodiments of operation 314, a word line is manufactured in a discrete portion which extend across one contact of a ROM transistor (or, across a conductive line electrically connected to and directly below a contact), but do not extend across conductive lines adjacent to the first conductive line in the ROM transistor, or an adjacent ROM transistor.

Figure 4:
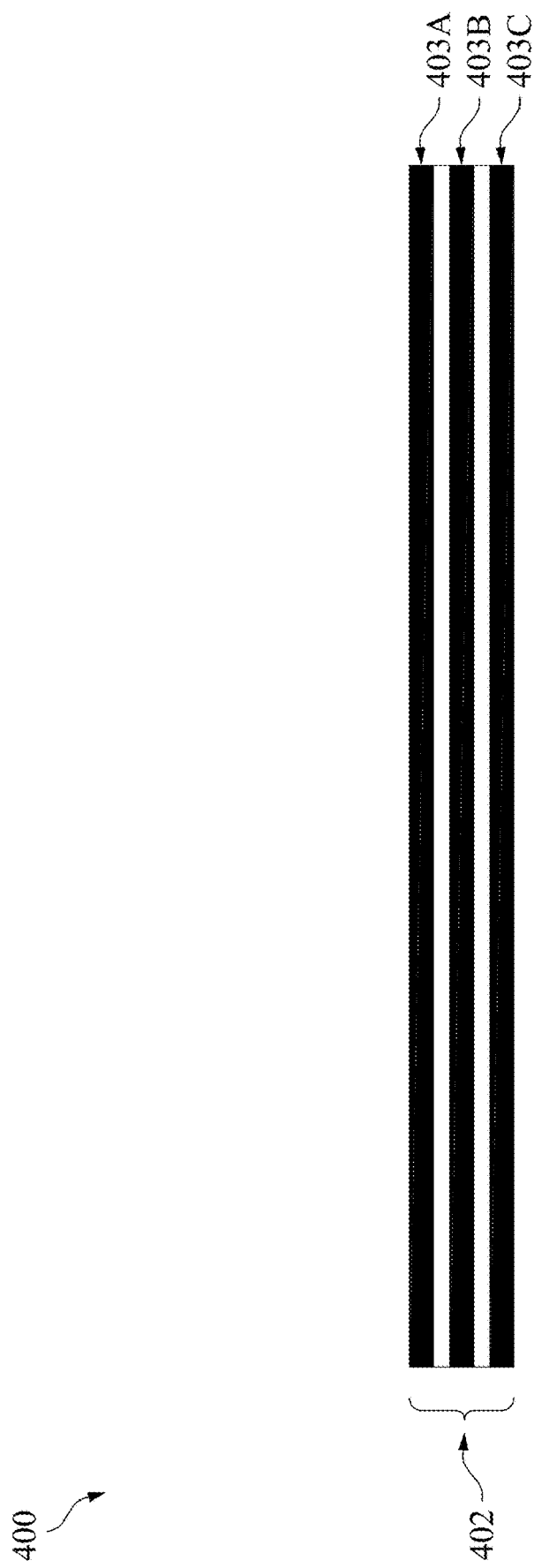
FIG. 4 is a top view of a ROM structure during a manufacturing process, in accordance with some embodiments.

FIG. 4 is a top view of a ROM structure 400 during a manufacturing process, in accordance with some embodiments. In FIG. 4, an active area 402 includes a layer of semiconductor material of a wafer. Active area 402 includes three individual paths for conducting current between a source and a drain of a ROM cell or a ROM transistor. As described above, in some embodiments, the active area includes fins of a FinFET. In some embodiments, the active area includes wires of a "gate-all-around" transistor. In some embodiments, the active area includes a two-dimensional transistor source/channel/drain structure, although other embodiments are also within the scope of the present disclosure. In some embodiments, the active area 402 includes a layer of intrinsic semiconductor material. In some embodiments, the active area 402 includes a layer of III-V semiconductor material, although other materials for the active area, including other semiconductor materials, are within the scope of the present disclosure. In the FIG. 4, active area 402 includes three fins 403A, 403B, and 403C which are configured to extend across a plurality of ROM transistors (see, e.g., first ROM cell 101A and second ROM cell 101B of FIG. 1, above).

Figure 5:
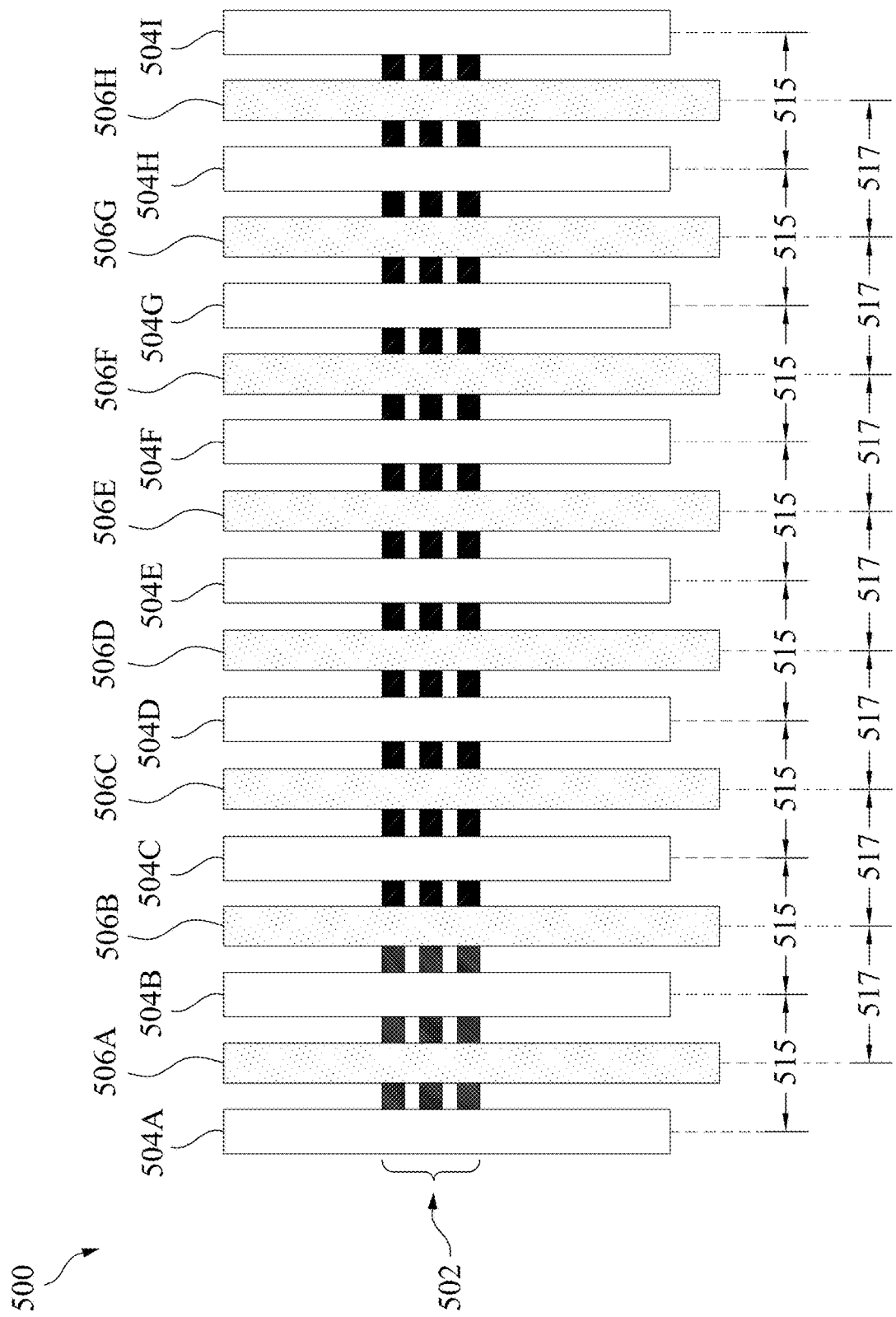
FIG. 5 is a top view of a ROM structure during a manufacturing process, in accordance with some embodiments.

FIG. 5 is a top view of a ROM structure 500 during a manufacturing process, in accordance with some embodiments. Elements of ROM structure 500 which have a same structure or function as ROM structure 400 have a same identifying numeral, incremented by 100. ROM structure 500 includes a plurality of conductive lines 504A-504I, extending across the active area 502. ROM structure 500 includes a plurality of gate electrodes 506A-506H which extend across the active area 502. Conductive lines 504A-504I have a conductive line separation interval 515 (e.g., a conductive line pitch interval) across the active area 502. The conductive line separation interval corresponds, in some embodiments, to the photolithography pitch interval between poly lines which electrically connect to source or drain regions of the active area. The photolithography pitch interval is determined by a process used to manufacture ROM structure 500. In some instances, the photolithography pitch interval is called a critical dimension. The conductive line pitch interval ranges, in some embodiments, from not less than 10 nm, to not more than 50 nm. In structures where the conductive line separation interval is greater than about 50 nm, the capacitance of the bit line or the word line is sufficiently small that the use of a trench isolation structure does not significantly change the capacitance. When the conductive line separation interval is smaller than about 10 nm, the addition of a trench isolation structure becomes difficult without having a negative impact on the conductive lines beside the trench isolation structure, and the trench isolation structure etch processes damage the source and drain regions of the ROM structure. Gate electrodes 506A-506H have a gate electrode separation interval 517 (e.g., a gate electrode pitch interval) across the active area 502. The gate electrode separation interval corresponds, in some embodiments, to the photolithography pitch interval between poly lines which correspond to gate electrodes of the ROM structures. The gate electrode separation interval ranges, in some embodiments, from not less than 10 nm, to not more than 50 nm. When the conductive line separation interval is smaller than about 10 nm, the addition of a trench isolation structure becomes difficult without having a negative impact on the conductive lines beside the trench isolation structure, and the trench isolation structure etch processes damage the source and drain regions of the ROM structure. In some embodiments, the gate electrode separation interval is the same as the conductive line separation interval. In some embodiments, the source of a first ROM transistor and the source of a second ROM transistor are on opposite sides of the first ROM transistor gate electrode, the First ROM drain, the second ROM drain, and the second ROM gate electrode, and are separated by two conductive line separation intervals. (see, e.g., conductive lines 804A and 804C in ROM structure 800 of FIG. 8A). Conductive lines 504A-504I are configured to be source lines and drain lines of ROM transistors, and gate electrodes 506A-506H are configured to be gate electrodes of ROM transistors in ROM structures. The formation of conductive lines 504A-504I is consistent with the performance of operation 306 of Method 300. The formation of gate electrodes 506A-506H is consistent with the performance of operation 304 of Method 300. According to some embodiments, a ROM cell having a trench isolation structure in a two-bit ROM cell (see, e.g., FIG. 7D, where conductive lines 704A-704C and gate electrodes 706A and 706B form a 2-bit ROM cell) has a ROM cell area decrease of 33% as compared to a ROM cell with a dummy gate electrode and a dummy conductive line next to the ROM cell.

Figure 6:
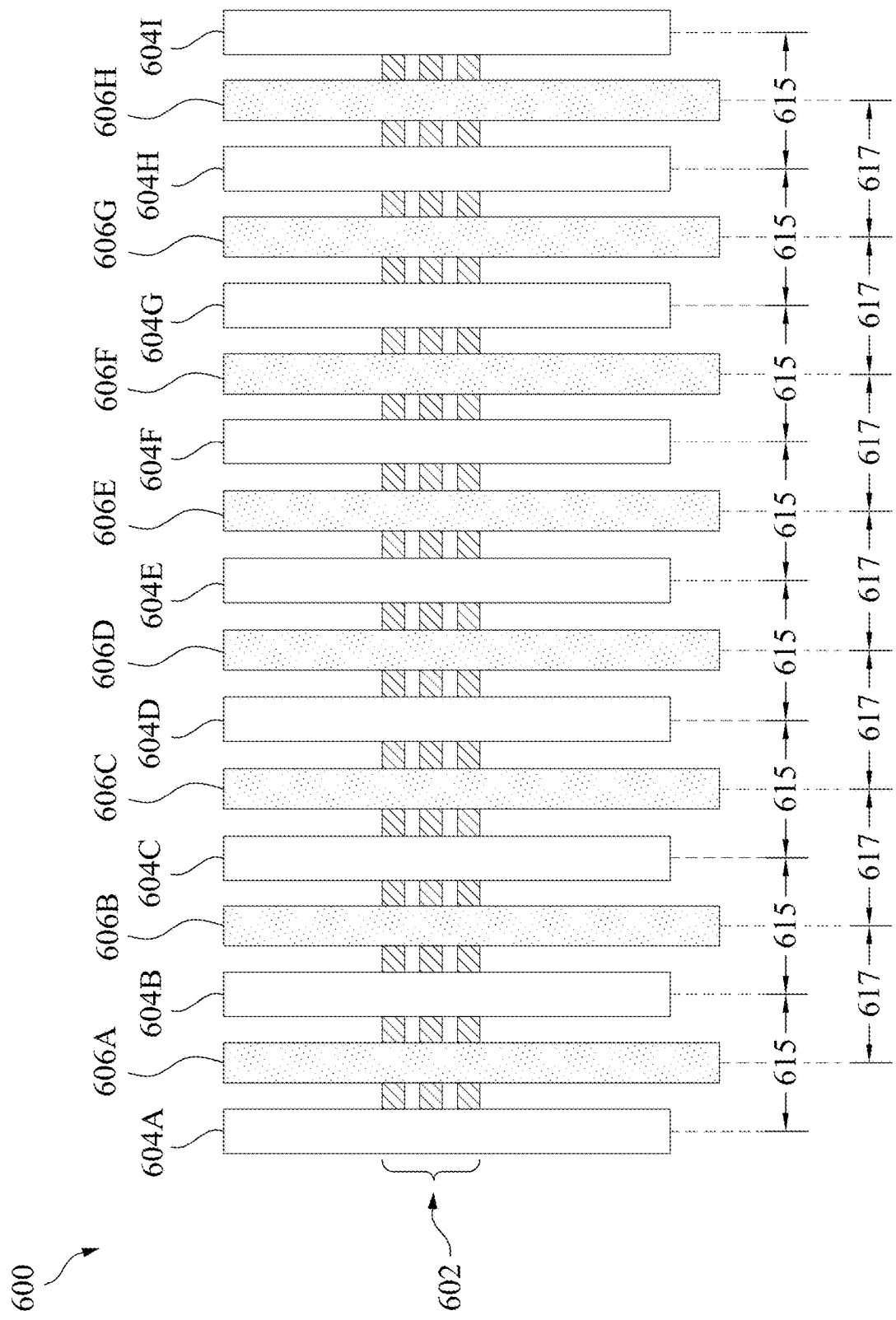
FIG. 6 is a top view of a ROM structure during a manufacturing process, in accordance with some embodiments.

FIG. 6 is a top view of a ROM structure 600 during a manufacturing process, in accordance with some embodiments. Elements of ROM structure 600 which have a same structure or function as ROM structure 500 have a same identifying numeral, incremented by 100. ROM structure 600 includes a doped active area 602. In some embodiments, source or drain portions of the active area 602 are implanted with dopant atoms to increase carrier mobility and reduce the switching threshold of the ROM transistors which use the active area. The channel region between source and drain portions of the active area (e.g., active area 602) is undoped. In some embodiments, active area 602 is implanted with dopants to form LDD regions adjacent to, or below, a gate electrode (see e.g., gate electrodes 606A-606H) of the integrated circuit. In some embodiments, implanting dopants into the active area 602 is performed at a normal (90°) angle with respect to the top surface of the active area. In some embodiments, implanting dopants into the active area is performed at an implantation angle of between 80° and 89.5° in order to direct dopant atoms into the LDD region below the gate electrode and shorten the gate length for the ROM transistor. In some embodiments, implanting dopants into active area 602 occurs before the ILD between conductive lines 604A-604I, and between gate electrodes 606A-606H.

FIGS. 7A-7D are top views of a ROM structure 700 during a manufacturing process, in accordance with some embodiments. Elements of ROM structure 700 which have a same structure or function as ROM structure 600 have a same identifying numeral, incremented by 100.

Figure 7A:
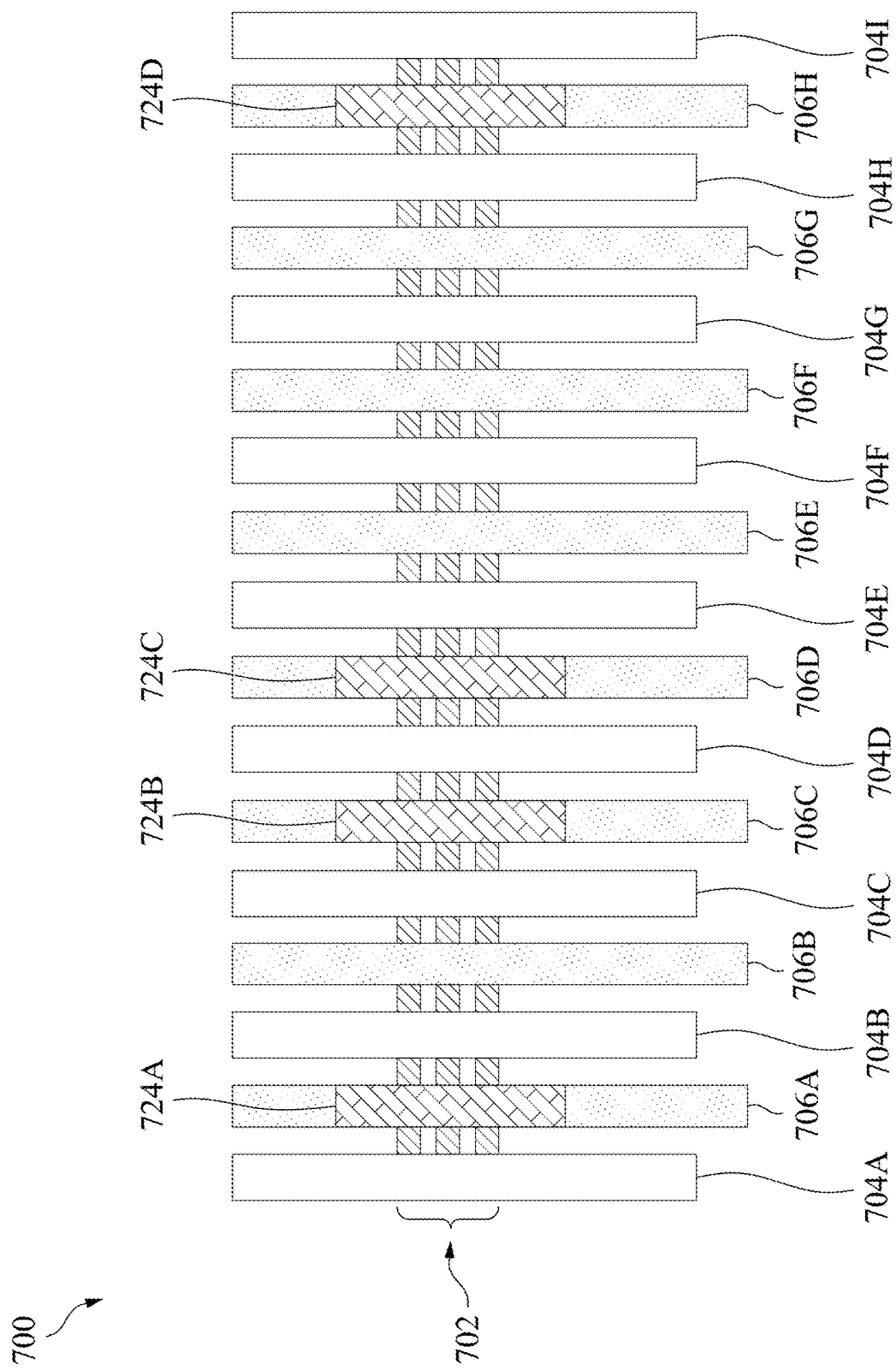
FIGS. 7A-7D are top views of a ROM structure during a manufacturing process, in accordance with some embodiments.

In FIG. 7A, trench isolation structures extend through portions of some gate electrodes. In ROM structure 700, trench isolation structure 724A divides gate electrode 706A into two portions, trench isolation structure 724B divides gate electrode 706C into two portions, trench isolation structure 724C divides gate electrode 706D into two portions, and trench isolation structure 724D divides gate electrode 706H into two portions. Trench isolation structures 724A-724D penetrate into active area 702 such that one portion of each gate electrode is on one side of active area 702, and the other portion of each gate electrode is on the other side of active area 702.

Figure 7B:
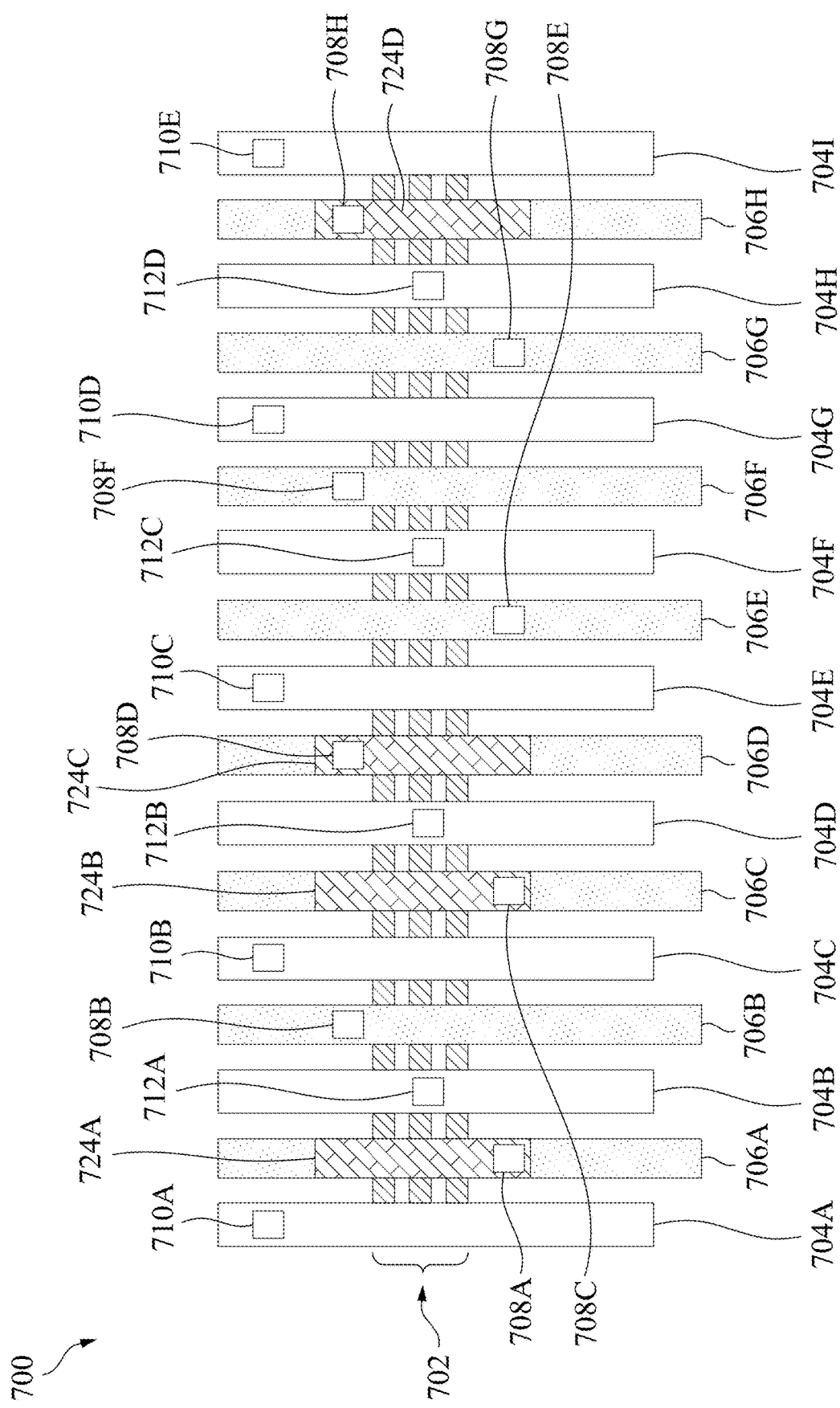

In FIG. 7B, an ILD (not shown) has been deposited over the conductive lines 704A-704I, and over gate electrodes 706A-706H of ROM structure 700, and vias formed in the ILD against the structures (conductive lines, gate electrodes, and so forth) below the ILD. Source contacts 710A connects to conductive line 704A, source contact 710B connects to conductive line 704C, source contact 710C connects to conductive line 704E, conductive line 710D connects to conductive line 704G, and source contacts 710E connects to conductive line 704I. Drain contact 712A connects to conductive line 704B, drain contact 712B connects to conductive line 704D, drain contact 712C connects to conductive line 704F, and drain contact 712D electrically connects to conductive line 704H. Gate electrode contact 708A electrically connects to a top surface of trench isolation structure 724A, gate electrode contact 708B connects to gate electrode 706B, gate electrode contact 708C connects to a top surface of trench isolation structure 724B, gate electrode contact 708D contacts the top surface of trench isolation structure 724C, gate electrode contact 708E electrically connects to gate electrode 706E, gate electrode contact 708F electrically connects to gate electrode 706F, gate electrode contact 708G electrically connects to gate electrode 706G, and gate electrode contact 708H contacts a top surface of isolation structure 724D. In some embodiments, the gate electrode contact directly over a gate electrode having a trench isolation structure dividing the gate electrode into two portions, the gate electrode contact is against a top surface of a portion of the gate electrode at one side of the trench isolation structure, and electrically isolated from the portion of the gate electrode at the other side of the trench isolation structure. Gate electrode contacts 708B, 708C, 708D, and 708H are electrically isolated from the gate electrodes having the same lateral position in the ROM cell or the array of gate electrodes.

Figure 7C:
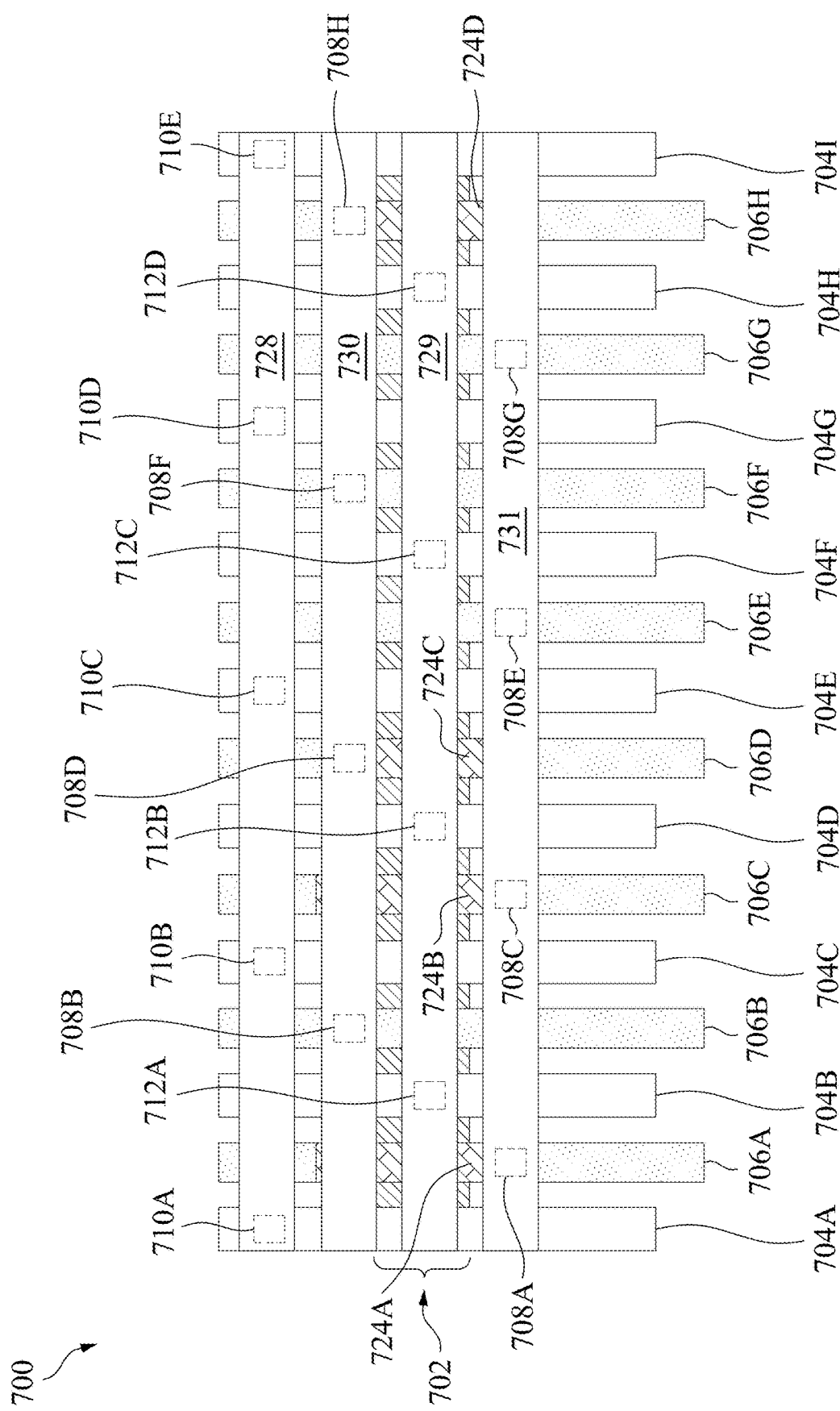

In FIG. 7C, ROM structure 700 includes a Vss power rail 728, a bit line 729, a first word line 730, and a second word line 731. Vss power rail 728 electrically connects to source contacts 710A-710E, bit line 729 electrically connects to drain contacts 712A-712D, first word line 730 electrically connects to gate electrode contacts 708B, 708D, 708F, and 708H, and second word line 731 electrically connects to gate electrode contacts 708A, 708C, 708E, and 708G. A layer of dielectric material (not shown) has been deposited over and around the source contacts, drain contacts, and gate electrode contacts, and the layer of dielectric material has been planarized to expose the top surface of the source contacts, the drain contacts, and the gate electrode contacts prior to deposition of the layer of dielectric material in which the Vss power rail, the bit line, and the word lines are manufactured.

Figure 7D:
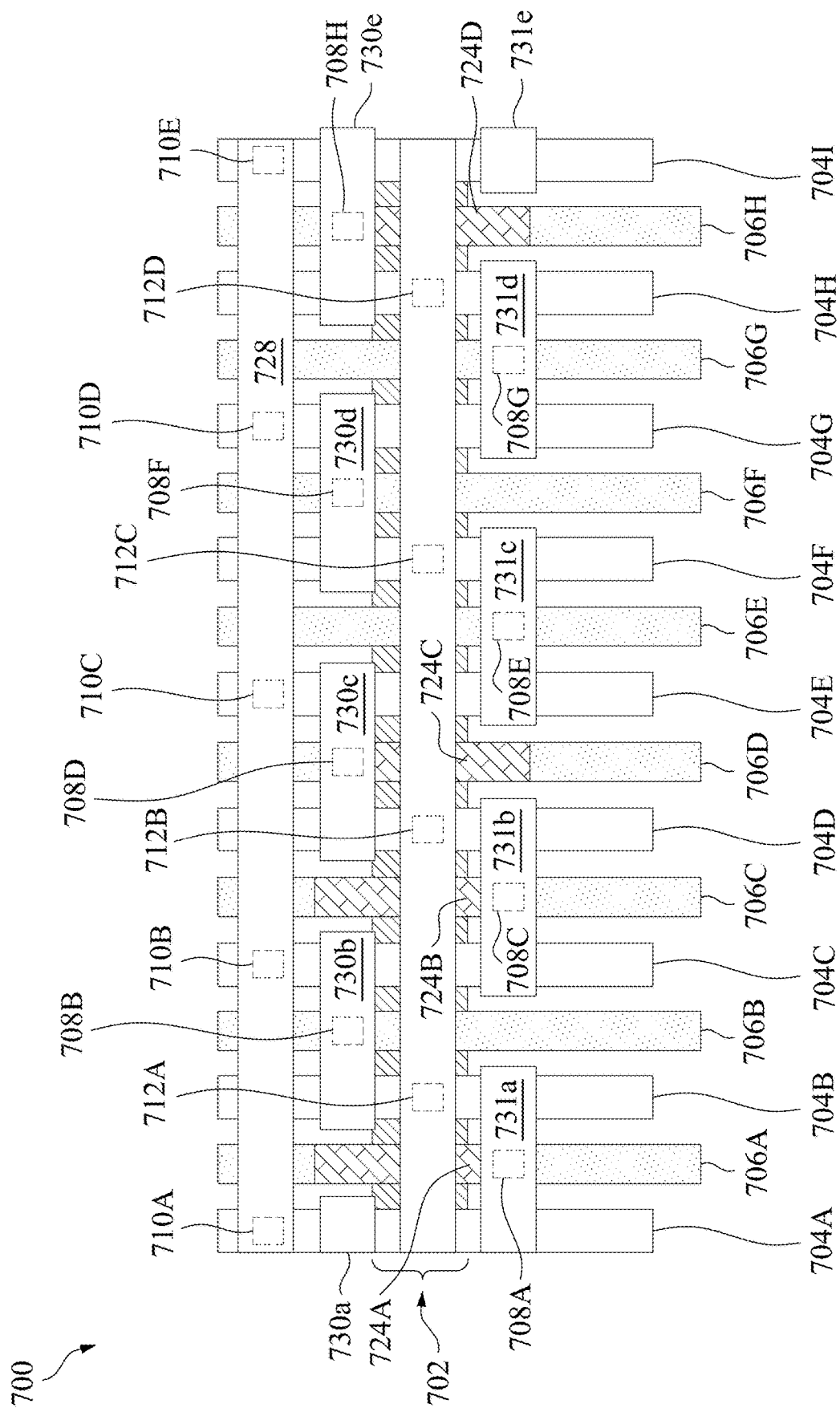

In FIG. 7D, the first word line and the second word line have been divided into word line portions, or word line segments, where each word line portion connects to a single contact of the underlying layer. Thus, word line portion 730*b* electrically connects to gate electrode contact 708B, word line portion 730*c* electrically connects to gate electrode contact 708D, word line portion 730*d* electrically connects to gate electrode contact 708F, and word line portion 730*e* electrically connects to gate electrode contact 708H. Word line portion 731*a* electrically connects to gate electrode contact 708A, word line portion 731*b* electrically connects to gate electrode contact 708C, word line portion 731*c* electrically connects to gate electrode contact 708E, and word line portion 731*d* electrically connects to gate electrode contact 708G.

Figure 7E:
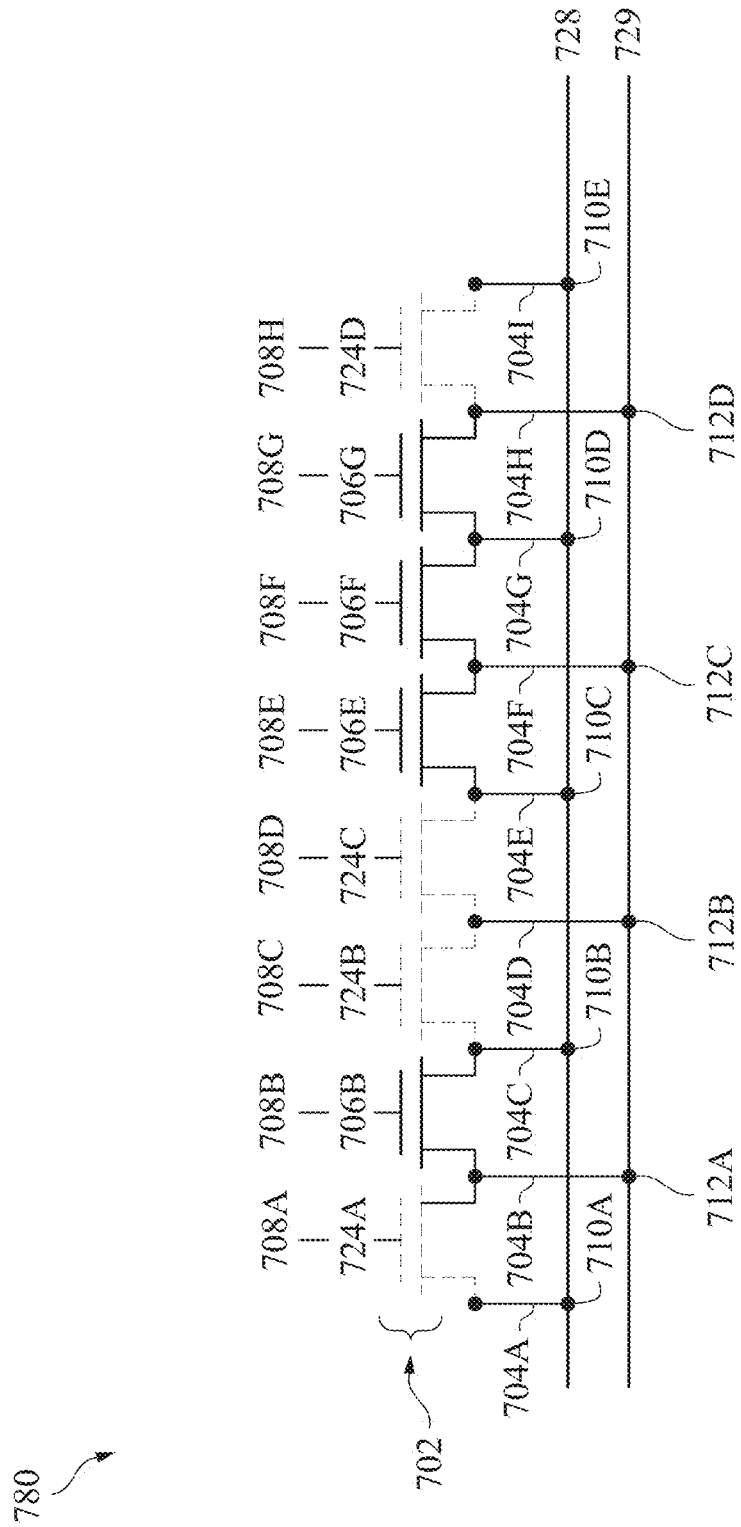
FIG. 7E is a circuit diagram of the ROM structure of FIG. 7D, in accordance with some embodiments.

FIG. 7E is a circuit diagram 780 of the ROM structure 700 as described in FIG. 7D, in accordance with some embodiments. Dashed lines in the circuit diagram 780 represent gate electrodes, or transistors, which have been "word-line programmed" to produce a "0"-bit value when the transistor is read, and solid lines indicate portions of the ROM structure 700 having functional electrical connections between the circuit elements with numbers represented in the circuit diagram 780. As described above, trench isolation structures 724A-724D electrically isolate gate electrode contacts 708A, 708C, 708D, and 708H from the bit line 729 and the Vss power rail 728. Gate electrode contacts 708B, 708E, 708F, and 708G are configured to electrically connect source contacts and drain contacts of the transistor to which the gate electrode contacts provide a switching voltage.

Figure 8A:
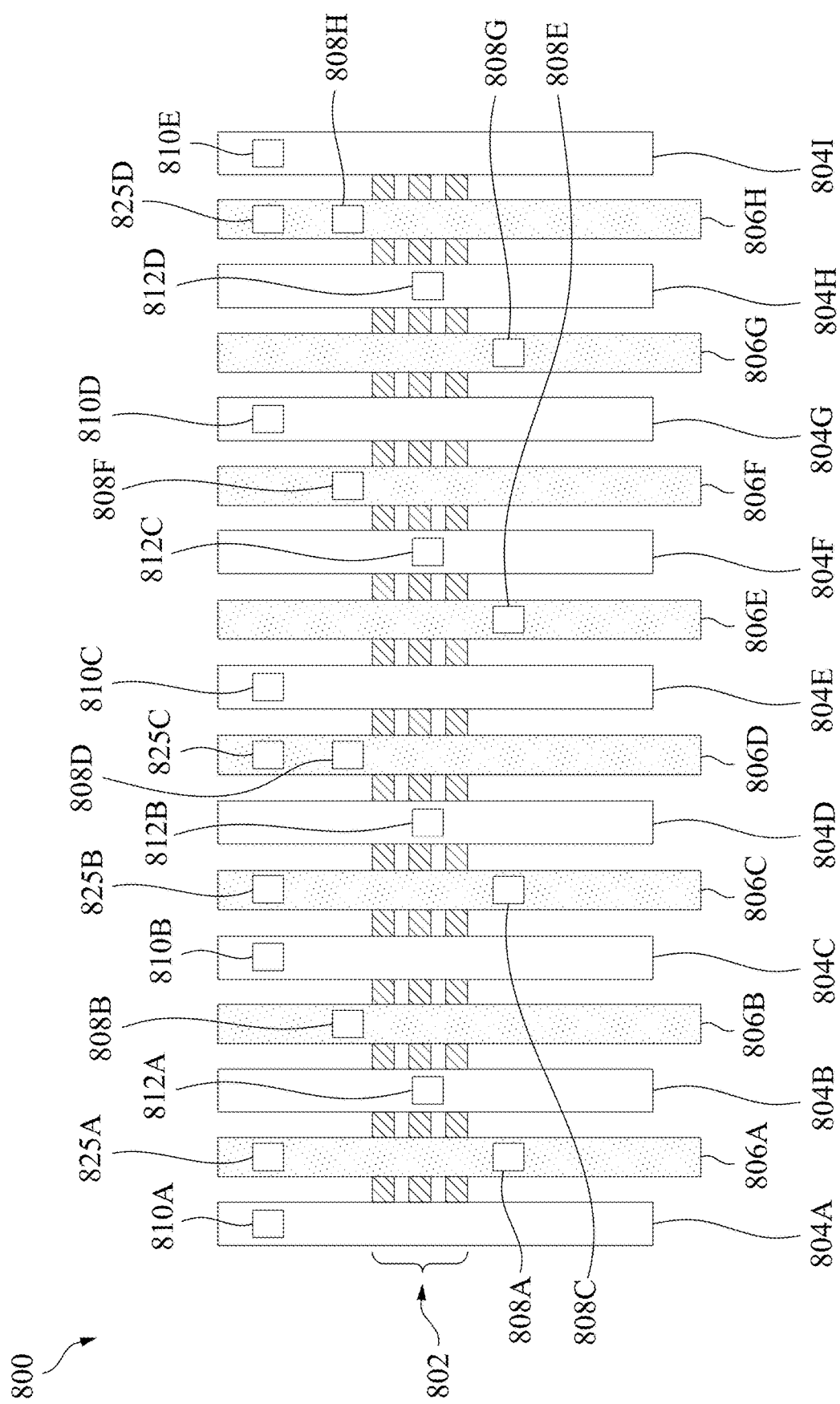
FIGS. 8A-8C are top views of a ROM structure during a manufacturing process, in accordance with some embodiments.
Figure 8B:
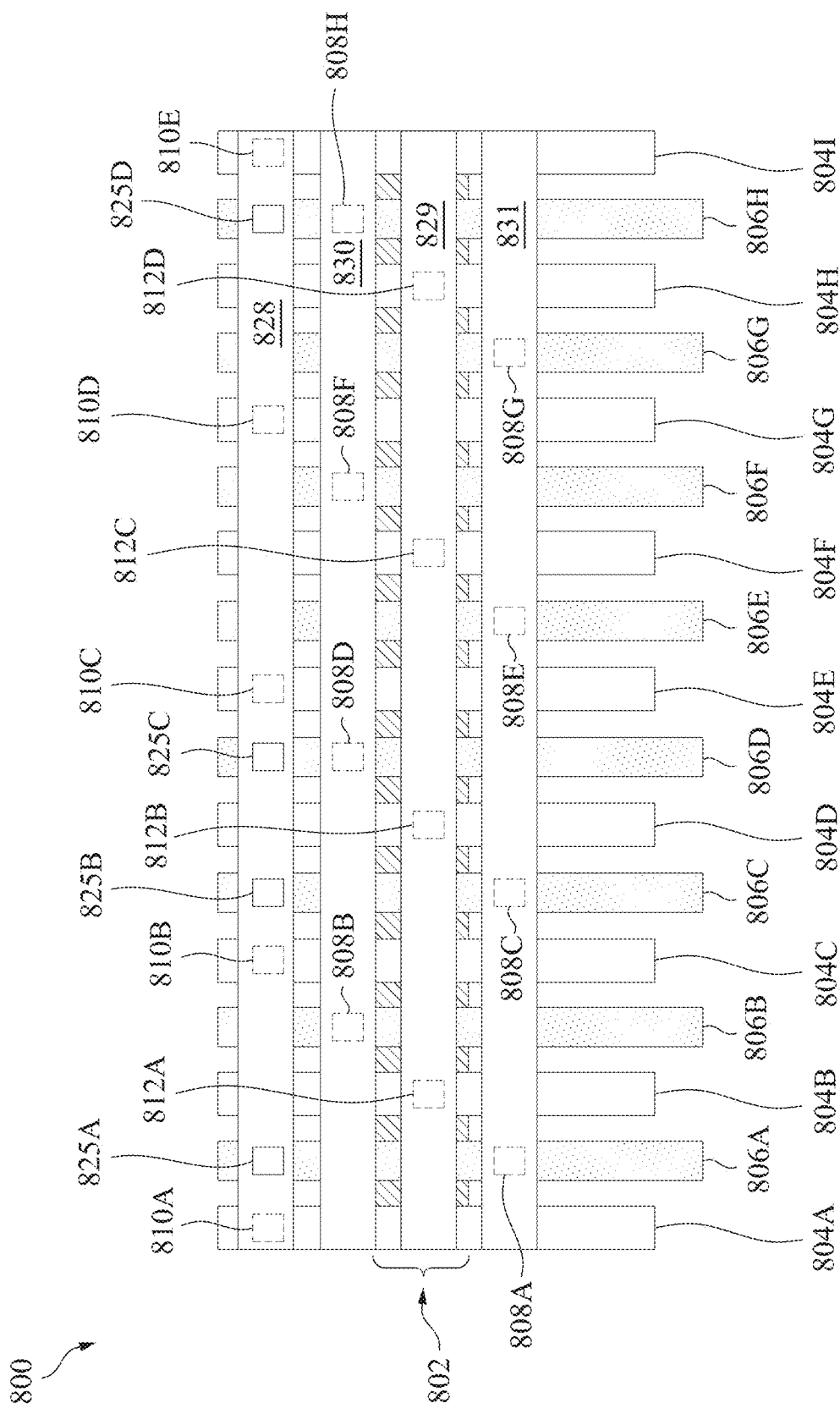
Figure 8C:
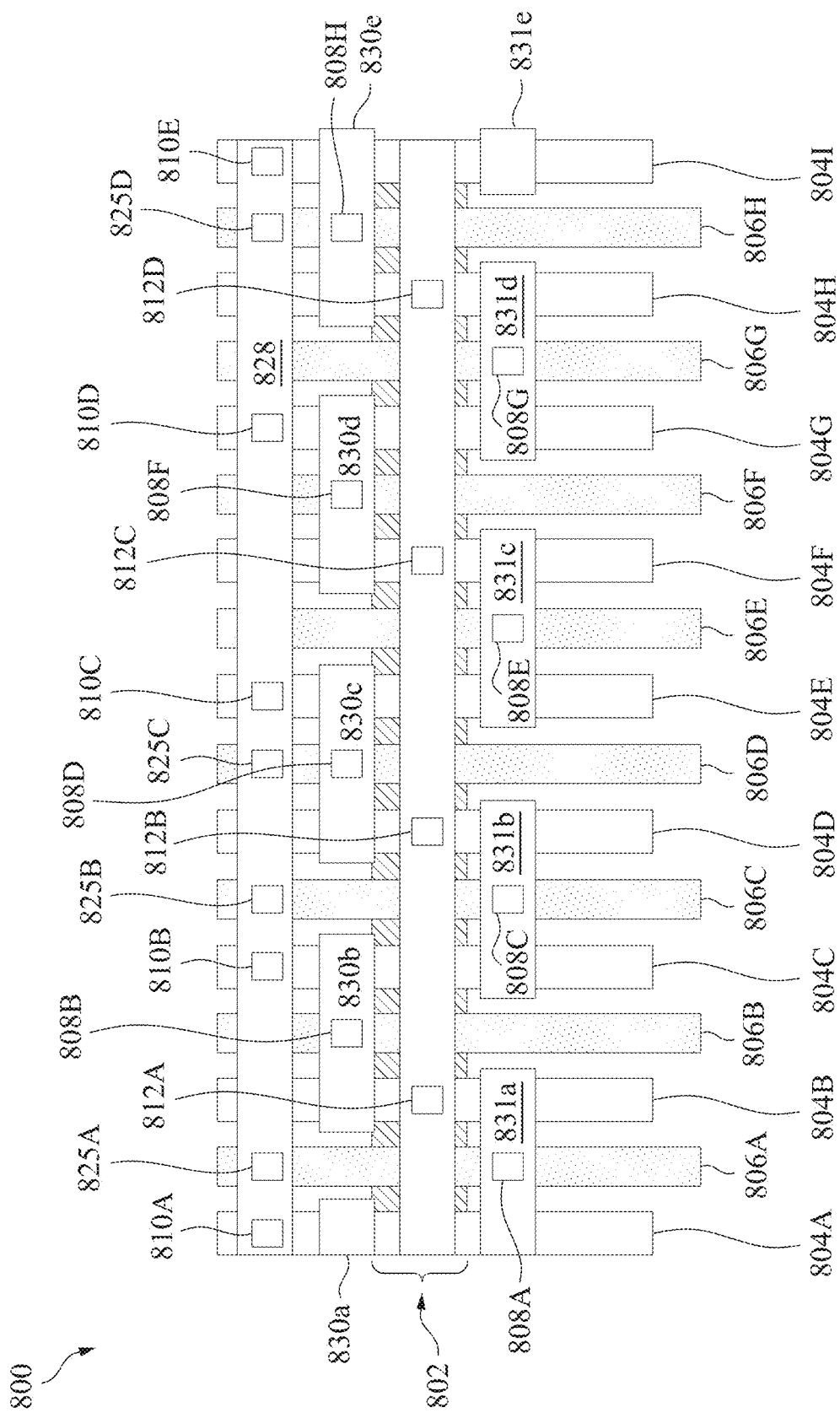

FIGS. 8A-8C are top views of a ROM structure 800 during a manufacturing process, in accordance with some embodiments. Elements of ROM structure 800 which have a same structure or function as ROM structure 700 have a same identifying numeral, incremented by 100. Differences between ROM structure 800 and ROM structure 700 of FIGS. 7A-7D are described below.

In FIG. 8A, ROM structure 800 has gate electrode tie-off contacts positioned over the gate electrodes to electrically connect the gate electrodes to the Vss power rail at a later stage of the manufacturing process. Thus, gate electrode tie-off contact 825A is electrically connected to gate electrode 806A and at a same lateral position along the gate electrode 806A as the source contact 810A is along conductive line 804A from the active area 802. Similarly, gate electrode tie-off contact 825B is at a same lateral position along the gate electrode 806C as the source contact 810B and source contact 810A and gate electrode tie-off contact 825A along gate electrode 806A. Gate electrode tie-off contact 825C and gate electrode tie-off contact 825D are aligned with source contacts 810A-810E and gate electrode tie-off contacts 825A and 825B to make electrical with a Vss power rail during the manufacturing process.

In FIG. 8B, a first ILD layer (not shown for clarity) has been deposited over and around the contacts directly against the top surface of the conductive lines 804A-804I, and against gate electrodes 806A-806H, and the first ILD layer has been planarized in order to expose the top surfaces of the contacts. Further, in FIG. 8B, a second ILD layer (not shown for clarity) has been deposited over the first ILD layer and the exposed top surfaces of the contacts in the first ILD layer. The second ILD layer has been etched with a pattern of trenches, and the trenches filled with conductive material to form Vss power rail 828, bit line 829, first word line 830, and second word line 831. Vss power rail 828 electrically connects to source contacts 810A, 810B, 810C, 810D, and 810E. Bit line 829 electrically connects to drain contact 812A, 812B, 812C, and 812D. First word line 830 electrically connects to gate electrode contacts 808B, 808D, 808F, and 808H. Second word line 831 electrically connects to gate electrode contacts 808A, 808C, 808E, and 808G. First word line 830 is between Vss power rail 828 and bit line 829. Bit line 829 is between first word line 830 and second word line 831. Gate electrode tie-off contacts 825A, 825B, 825C, and 825D electrically connect to Vss power rail 838 and to source contacts 810A, 810B, 810C, 810D, and 810E.

In FIG. 8C, the first word line and the second word line have been divided into word line portions, or word line segments, where each word line portion connects to a single contact of the underlying layer. Thus, word line portion 830*b* electrically connects to gate electrode contact 808B, word line portion 830*c* electrically connects to gate electrode contact 808D, word line portion 830*d* electrically connects to gate electrode contact 808F, and word line portion 830*e* electrically connects to gate electrode contact 808H. Word line portion 831*a* electrically connects to gate electrode contact 808A, word line portion 831*b* electrically connects to gate electrode contact 808C, word line portion 831*c* electrically connects to gate electrode contact 808E, and word line portion 831*d* electrically connects to gate electrode contact 808G.

Figure 8D:
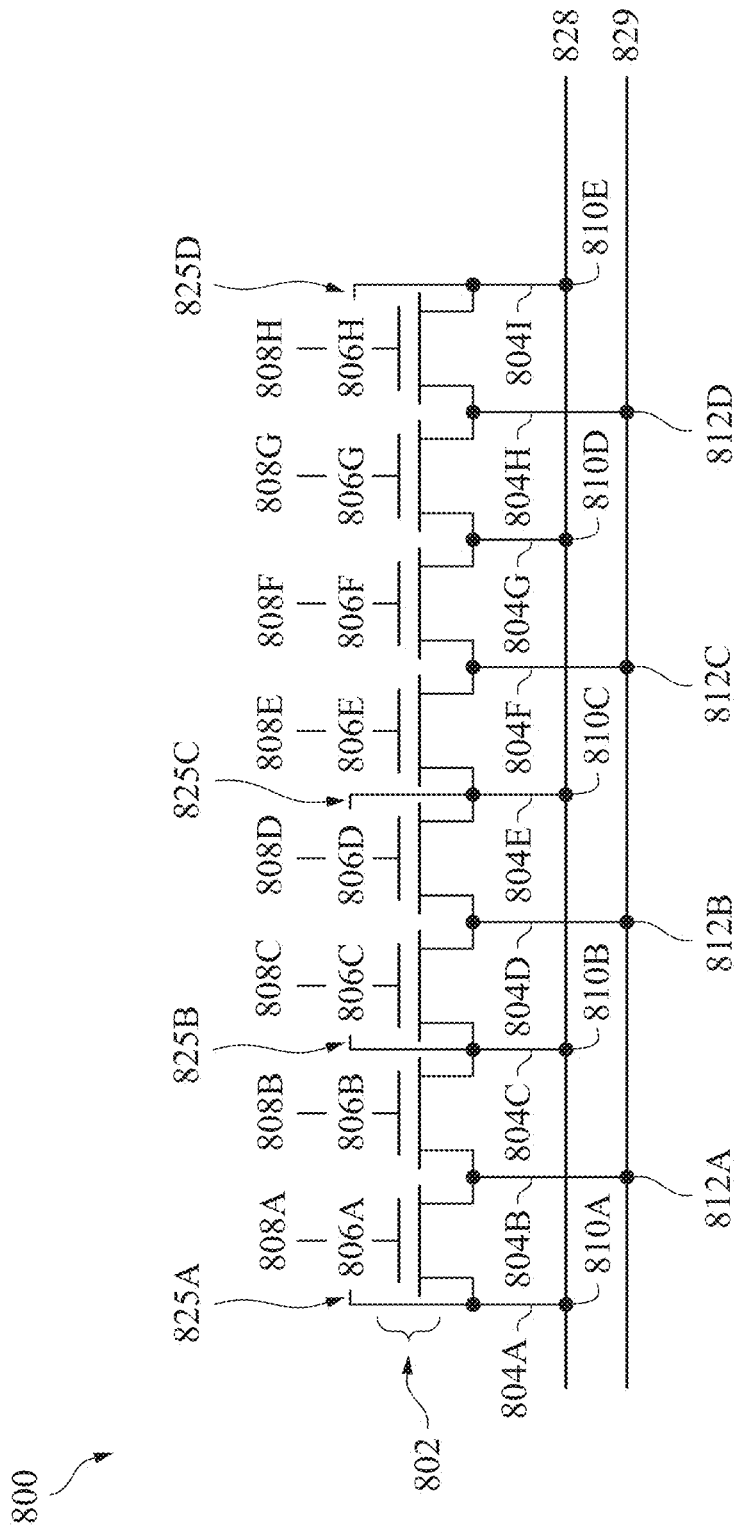
FIG. 8D is a circuit diagram of the ROM structure of FIG. 8C, in accordance with some embodiments.

FIG. 8D is a circuit diagram 880 of the ROM structure 800 as described in FIG. 8C, in accordance with some embodiments. Gate electrode tie-off contact 825A electrically connects gate electrode 806A to Vss power rail 828, gate electrode tie-off contact 825B electrically connects gate electrode 806C to Vss power rail 828, gate electrode tie-off contact 825C electrically connects gate electrode 806D to Vss power rail 828, and gate electrode tie-off contact 825D electrically connects gate electrode 806H to Vss power rail 828 and source contact 810E. In the circuit diagram 880, the gate electrodes which are electrically connected to the Vss power rail 828 (e.g., gate electrodes 806A, 806C, 806D, and 806H) are configured to provide a "0" bit result when read, and the remaining gate electrodes (806B, 806E, 806F, and 806G) which are not electrically connected to the Vss power rail 828 are configured to provide a "1" bit result when read.

FIGS. 9A-9D are cross-sectional diagrams of a ROM structure 900, in accordance with some embodiments. Elements of ROM structure 900 which have a similar structure and function as elements of ROM structure 100 have a same identifying numeral, incremented by 800.

Figure 9A:
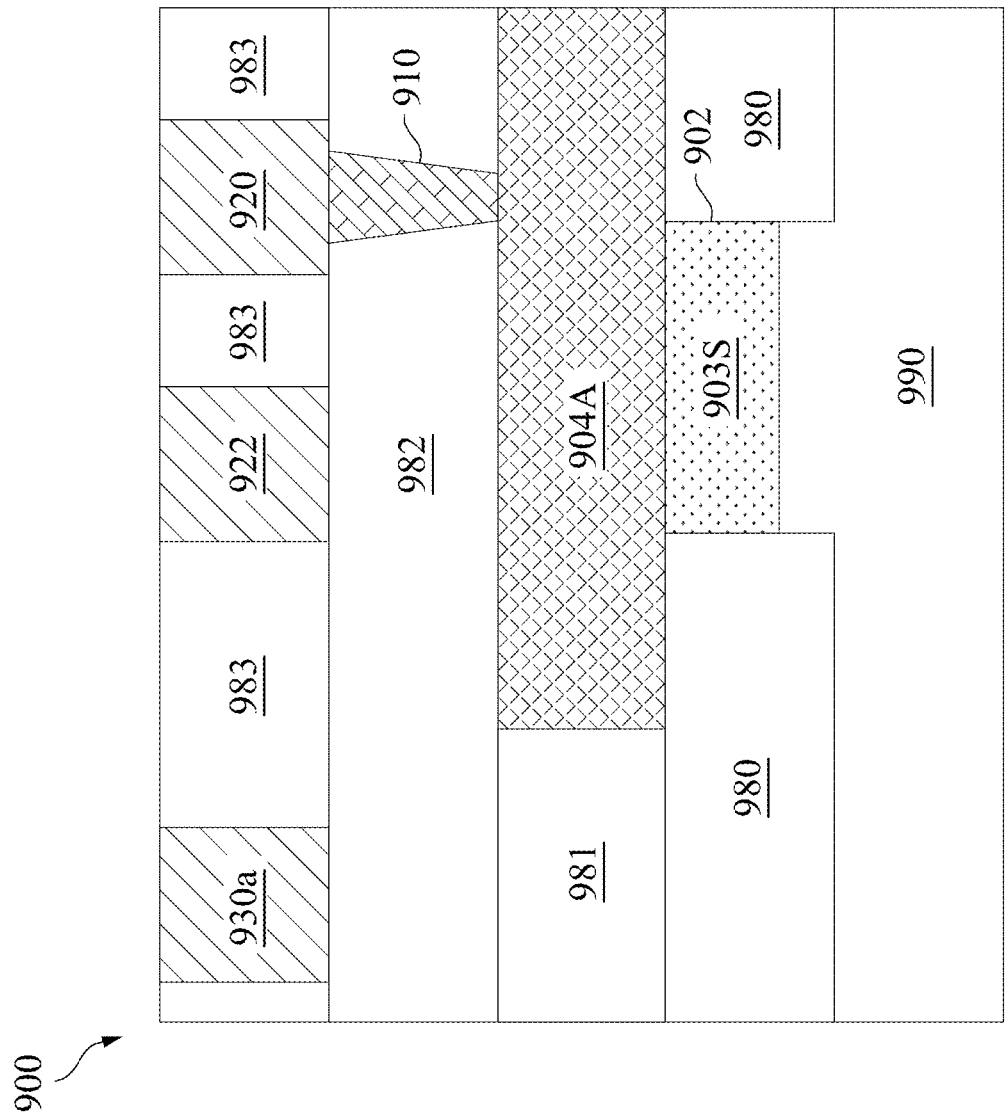
FIGS. 9A-9E are cross-sectional diagrams of a ROM structure, in accordance with some embodiments.

FIG. 9A is a cross-sectional view corresponding to the cross-sectional view A-A' extending through ROM structure 100. Cross-sectional view A-A' extends through a source region of a transistor in a ROM structure 100. In FIG. 9A, source region 903S is part of an active area 902 extends above the bulk of substrate 990, and is bounded on either side by isolation material 980. In some embodiments, isolation material is a dielectric material which has been deposited into openings formed in the substrate 990 around the active area 902. In some embodiments, the dielectric material is silicon dioxide or some other dielectric material compatible with electrically isolation of transistors in an integrated circuit. Conductive line 904A extends across the top surface of source region 903S and electrically connects source region 903S to source contact 910. Source contact 910 electrically connects to Vss power rail 920. ILD 981 electrically isolates source contact 910 from other conductive lines in integrated circuit above the active area 902. In some embodiments, ILD 981 is an insulating material such as silicon dioxide or some other dielectric material compatible with electrically isolating contacts, conductive lines, and gate electrodes around a gate. ILD 982 electrically isolates Vss power rail 920, bit line 922, and word line 930*a* from conductive line 904A. ILD 983 electrically isolates word line 930*a* from bitline 92 and Vss power rail 920, and from source contact 910 below Vss power rail 920.

Figure 9B:
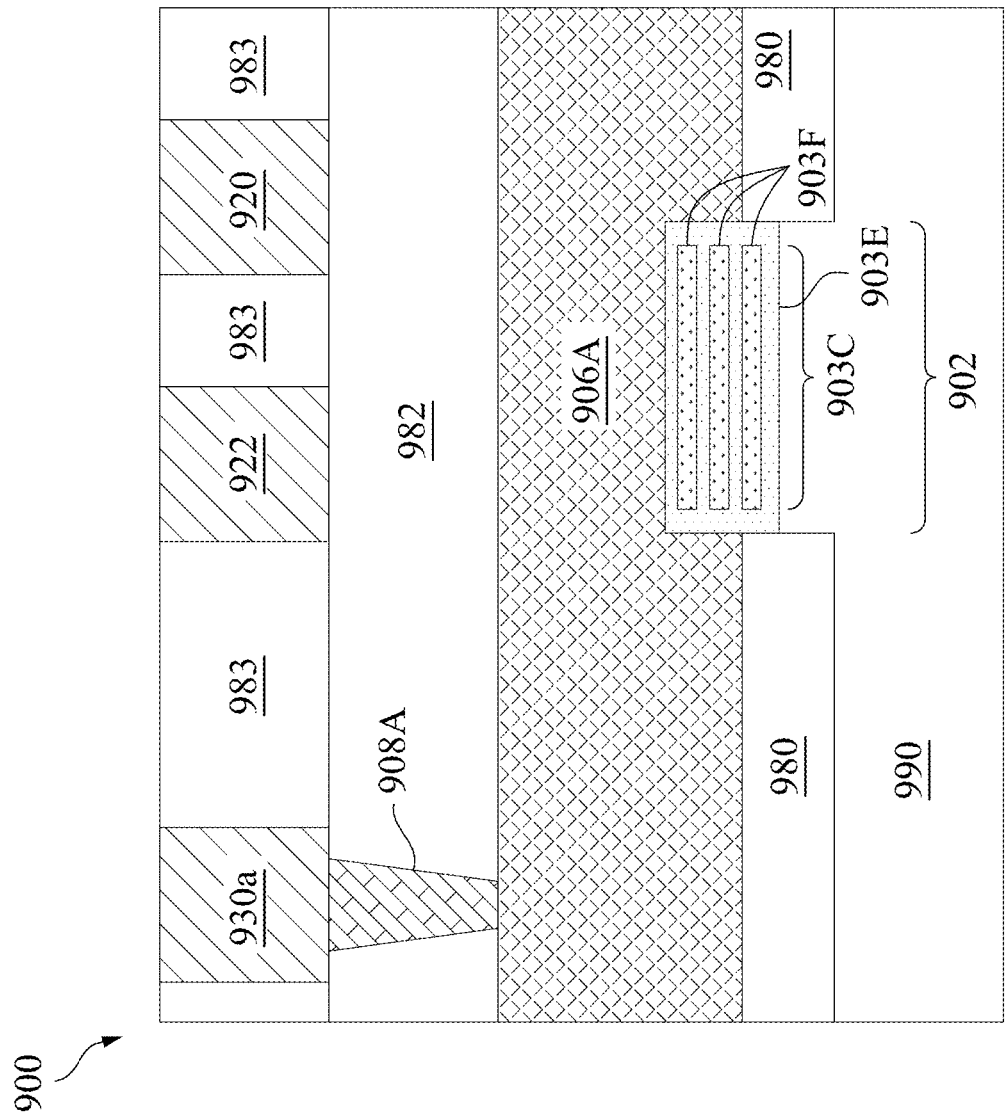

FIG. 9B is a cross-sectional view corresponding to the cross-sectional view B-B' extending through ROM structure 100. Cross sectional view B-B' extends through a gate electrode/channel region of ROM structure 100. In FIG. 9B, ILD 983 electrically isolates word line 930*a* from bitline 92 and Vss power rail 920, and from source contact 910 below Vss power rail 920. Gate electrode contact 908A electrically connects word line 930*a* to gate electrode 906A. Gate electrode 906A extends over channel region 903C of active area 902. Gate electrode extends over ILD 980 and is electrically isolated from bit line 922, word line 930*a*, and Vss power rail 920 by ILD 982. In some embodiments, gate electrode covers all of the sides of gate dielectric material 903E around channels of semiconductor material 903F in channel region 903C.

Figure 9C:
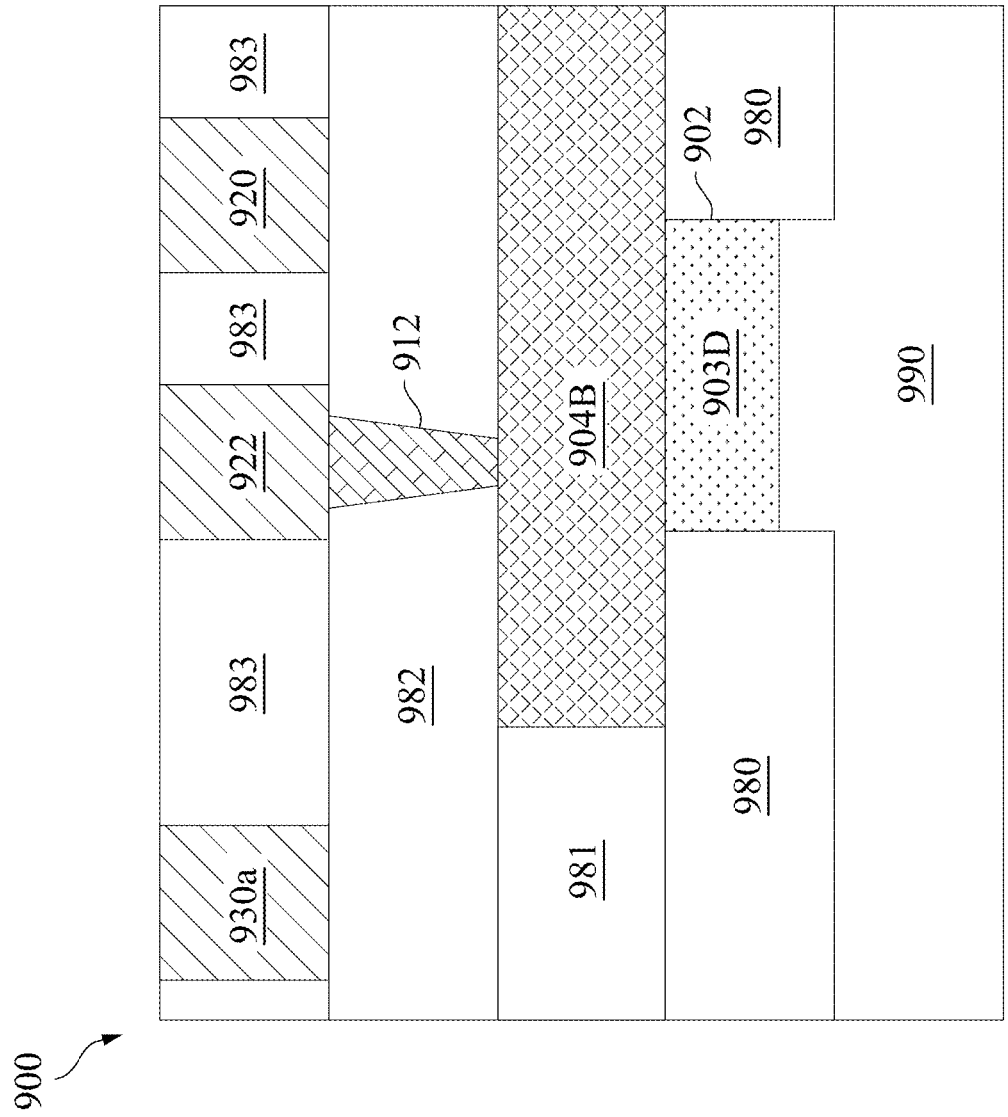

FIG. 9C is a cross-sectional view corresponding to the cross-sectional view C-C' extending through ROM structure 100. Cross-sectional view C-C' extends through a drain region of ROM structure 100. In FIG. 9C, drain region 903D is surrounded at the sides by ILD 980 above substrate 990. Conductive line 904B electrically connects the drain region 903D to drain contact 912. Drain contact 912 extends through ILD 982 and electrically connects bitline 922 to conductive line 904B and drain region 903D. ILD 983 separates bitline 922 form Vss power rail 920 and wordline 930*a*.

Figure 9D:
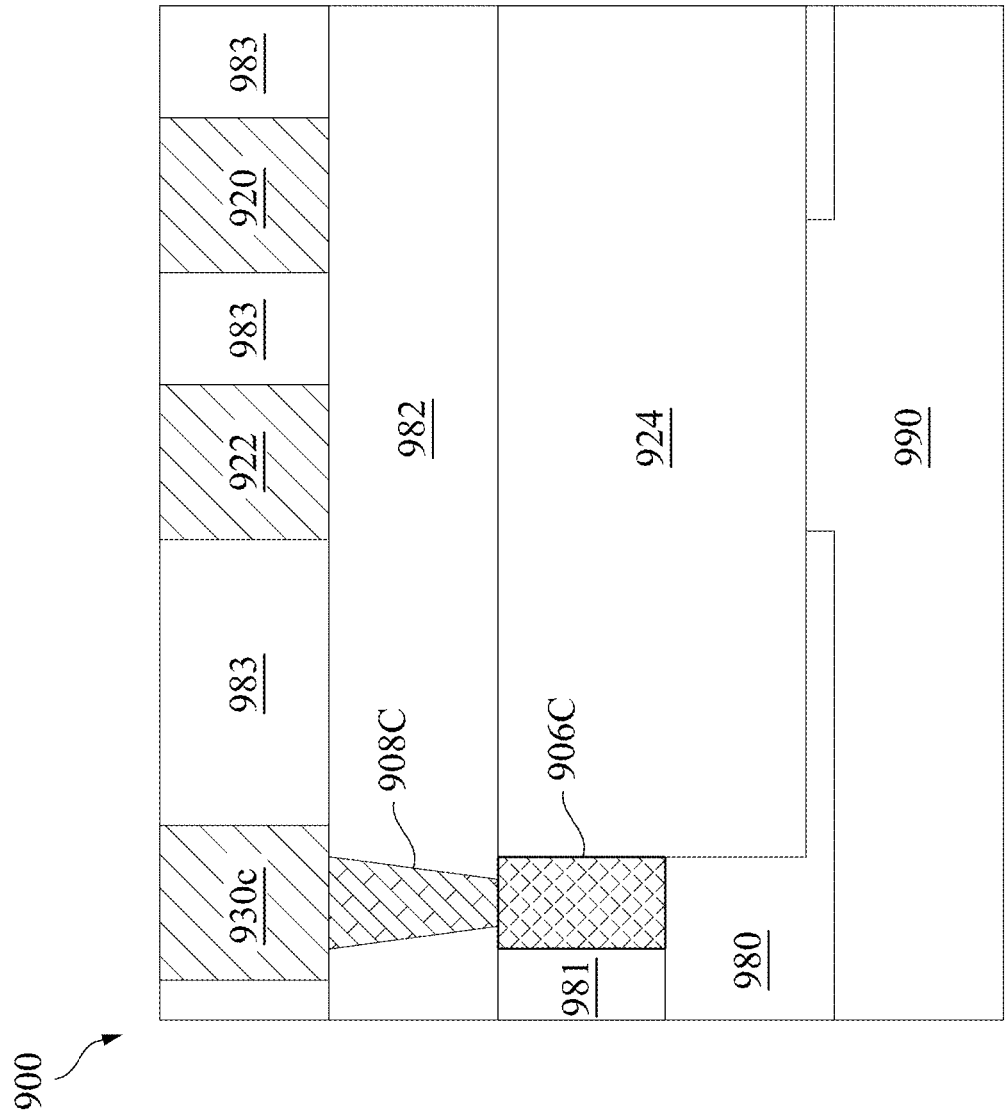

FIG. 9D is a cross-sectional view corresponding to cross-sectional view D-D' extending through ROM structure 100. Cross-sectional view D-D' extends through a trench isolation structure 124 of ROM structure 100, located at the position of a gate electrode which has been etched away to make space for the trench isolation structure. In FIG. 9D, trench isolation structure 924 extends from ILD 982 to ILD 980 and substrate 990. Gate electrode 906C is over ILD 980, under ILD 982, and between ILD 981 and trench isolation structure 924. Gate electrode 924 is a remnant of a gate electrode which extended over the active area of the transistor, and was removed by an etch process before the trench isolation structure was formed by depositing a dielectric material into the opening formed after removing the gate electrode over the active area. Gate electrode contact 908C electrically connects gate electrode 906C to wordline 930*c*. ILD 983 electrically separates wordline 930*c* from bitline 922 and Vss power rail 920.

Figure 9E:
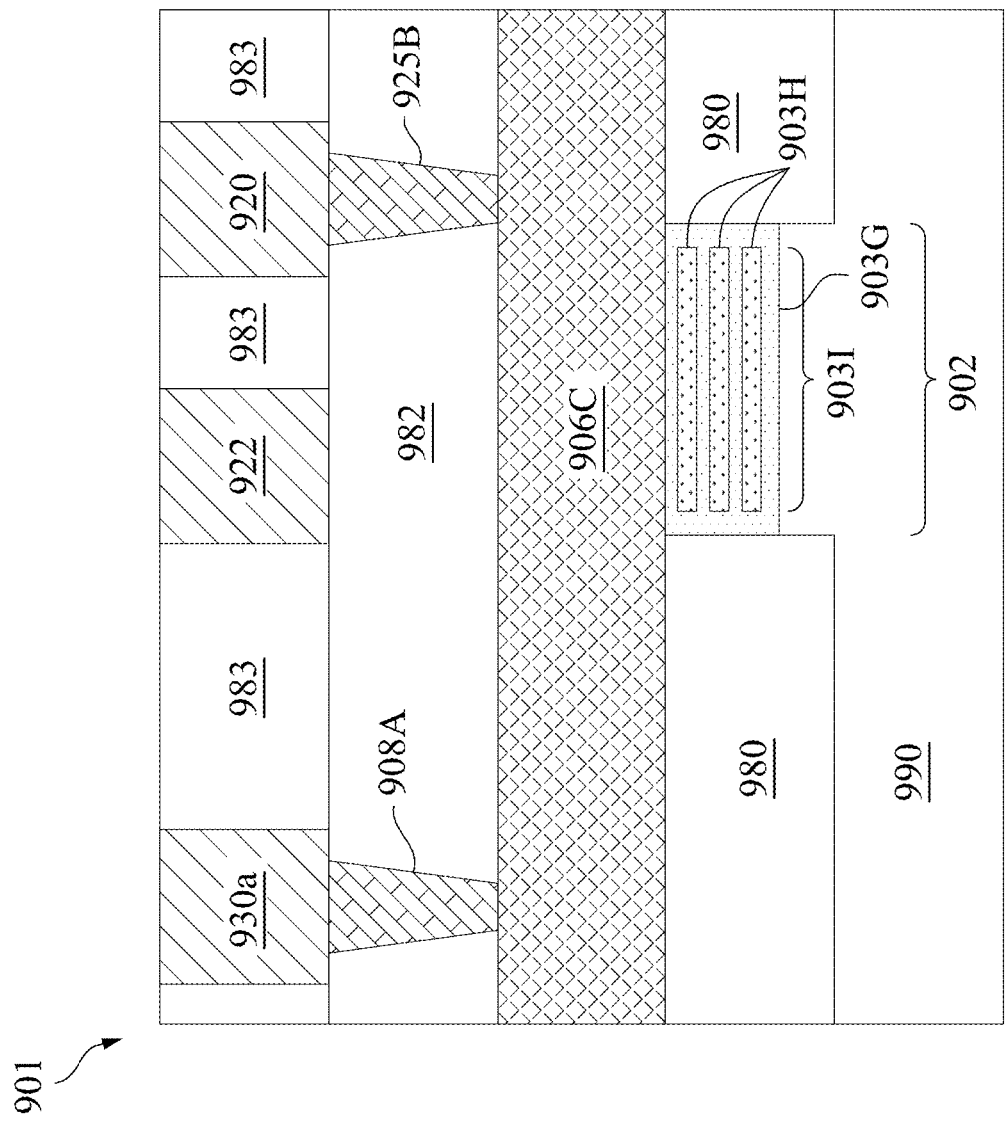

FIG. 9E is a cross-sectional diagram of a ROM structure 901, in accordance with some embodiments. Elements of ROM structure 901 which have a similar structure and function as elements of ROM structure 200 have a same identifying numeral, incremented by 700. In FIG. 9E, gate dielectric material 903G extends around channels of semiconductor material 903H in channel region 903I of active area 902. Gate electrode 906C is electrically coupled to channel region 903I and directly against gate dielectric material 903G. In some embodiments, gate dielectric material is against the channels of semiconductor material, and a semiconductor material surrounds the channels of semiconductor material and the gate dielectric material. Gate electrode contact 908A electrically connects word line 930a to gate electrode 906C. Gate electrode tie-off contact 925B electrically connects Vss power rail 920 to gate electrode 906C, such that wordline 930a and Vss power rail 920 are electrically connected to each other. Thus, when a voltage is applied to gate electrode 906C, the voltage is bled off to Vss power rail 920 and the channel region 903I is not activated (e.g., the gate electrode is shorted to an "off" setting because any applied voltage is automatically bled off). Thus, by the addition of a gate electrode tie-off contact, the programming of a ROM structure occurs without having to perform additional masking, etching, or deposition steps in manufacturing the ROM structure.

Figure 10:
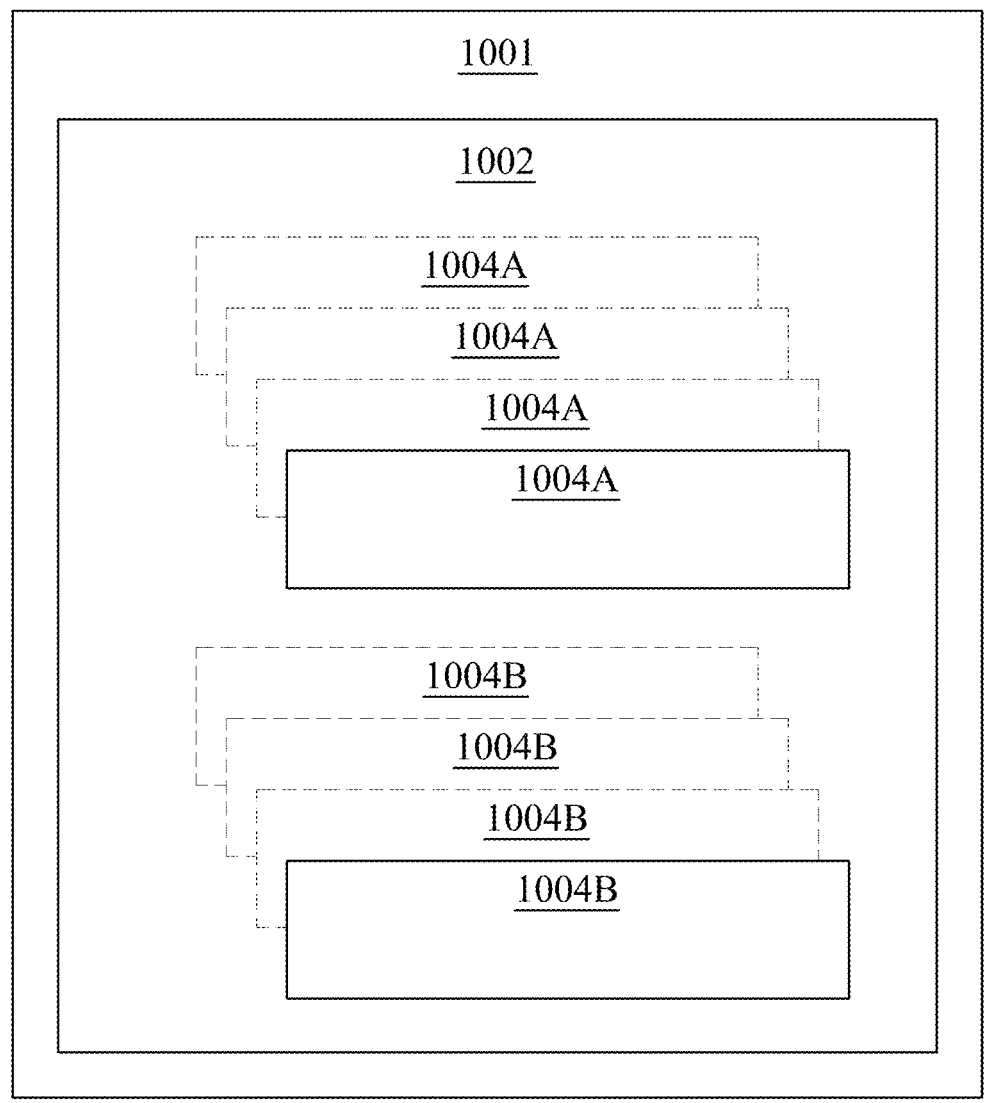
FIG. 10 is a block diagram of an integrated circuit having a semiconductor device in accordance with at least one embodiment of the present disclosure

FIG. 10 is a block diagram of an integrated circuit 1000 having a semiconductor device 1001 in accordance with at least one embodiment of the present disclosure. In FIG. 10, semiconductor device 1001 includes, among other things, a circuit macro (hereinafter, macro) 1002. In some embodiments, macro 1002 is a ROM macro with a trench isolation structure, as described above in FIG. 3. In some embodiments, macro 1002 is a ROM macro having some ROM cells with a source and a gate electrode of the ROM cell both electrically connected to a Vss power rail. Macro 1002 includes, among other things, a wire routing arrangement 1004. Example of layout diagrams resulting in wire routing arrangement 1004 include the routing arrangement layout diagrams in each of each of FIGS. 1-2 and 4-8D, provided above.

Figure 11:
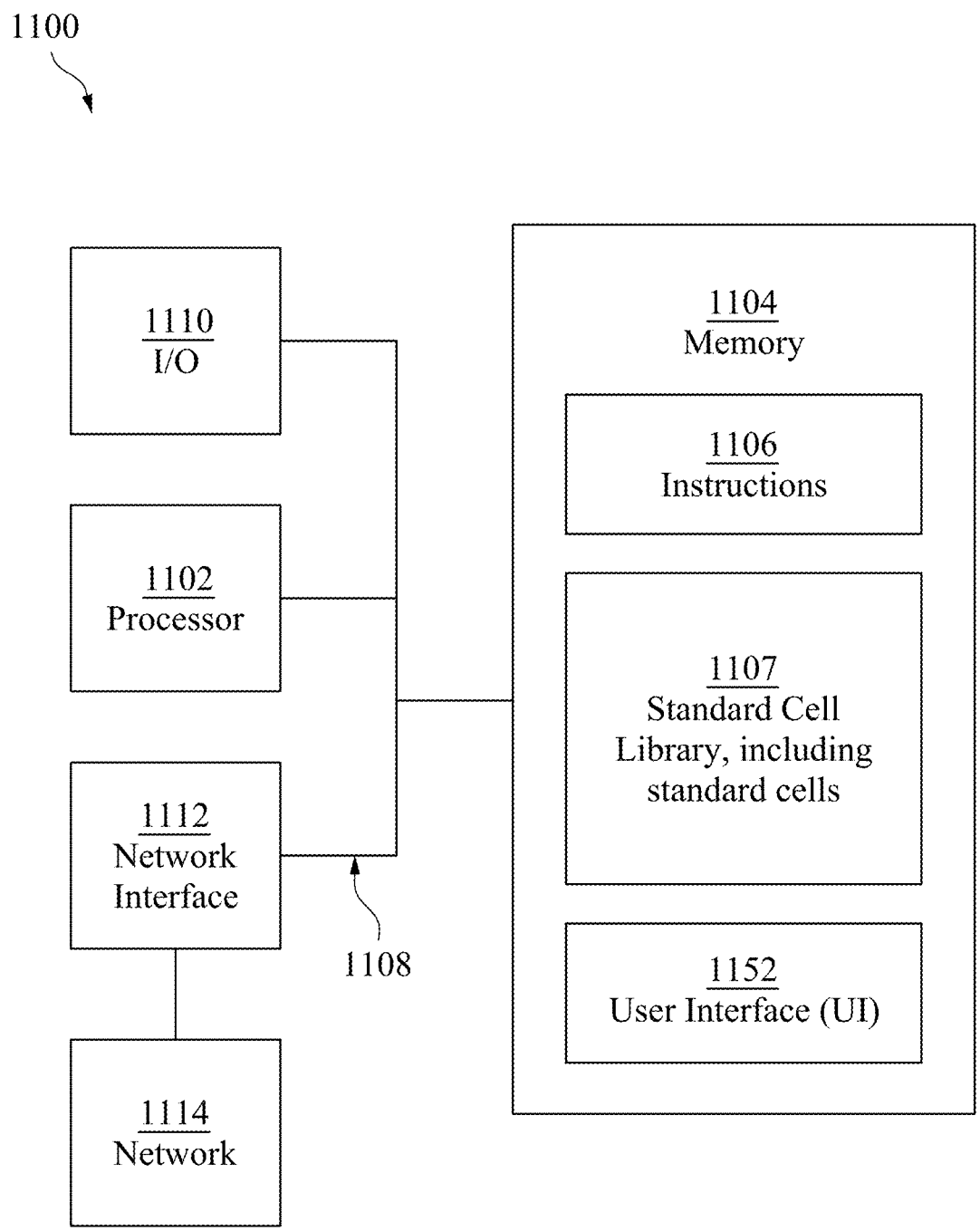
FIG. 11 is a block diagram of an electronic design automation (EDA) system in accordance with some embodiments.

FIG. 11 is a block diagram of an electronic design automation (EDA) system 1100 in accordance with some embodiments.

In some embodiments, EDA system 1100 is a general purpose computing device including a hardware processor 1102 and a non-transitory, computer-readable storage medium 1104. Storage medium 1104, amongst other things, is encoded with, i.e., stores, computer program code 1106, i.e., a set of executable instructions. Execution of instructions 1106 by hardware processor 1102 represents (at least in part) an EDA tool which implements a portion or all of, e.g., the methods described herein in accordance with one or more (hereinafter, the noted processes and/or methods).

Processor 1102 is electrically coupled to computer-readable storage medium 1104 via a bus 1108. Processor 1102 is also electrically coupled to an I/O interface 1110 by bus 1108. A network interface 1112 is also electrically connected to processor 1102 via bus 1108. Network interface 1112 is connected to a network 1114, so that processor 1102 and computer-readable storage medium 1104 are capable of connecting to external elements via network 1114. Processor 1102 is configured to execute computer program code 1106 encoded in computer-readable storage medium 1104 in order to cause EDA system 1100 to be usable for performing a portion or all of the noted processes and/or methods. In one or more embodiments, processor 1102 is a central processing unit (CPU), a multi-processor, a distributed processing system, an application specific integrated circuit (ASIC), and/or a suitable processing unit.

In one or more embodiments, computer-readable storage medium 1104 is an electronic, magnetic, optical, electromagnetic, infrared, and/or a semiconductor system (or apparatus or device). For example, computer-readable storage medium 1104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1104 includes a compact disk-read only memory (CD-ROM), a compact disk-read/write (CD-R/W), and/or a digital video disc (DVD).

In one or more embodiments, computer readable storage medium (e.g., storage medium) 1104 stores computer program code 1106 (e.g., instructions) configured to cause EDA system 1100 (where such execution represents (at least in part) the EDA tool) to be usable for performing a portion or all of the noted processes and/or methods. In one or more embodiments, storage medium 1104 also stores information (the stored information pattern) which facilitates performing a portion or all of the noted processes and/or methods. In one or more embodiments, storage medium 1104 stores a library 1107 of standard cells including such standard cells as disclosed herein.

EDA system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1102.

EDA system 1100 also includes network interface 1112 coupled to processor 1102. Network interface 1112 allows EDA system 1100 to communicate with network 1114, to which one or more other computer systems are connected. Network interface 1112 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 1100.

EDA system 1100 is configured to receive information through I/O interface 1110. The information received through I/O interface 1110 includes one or more of instructions, data, design rules, libraries of standard cells, and/or other parameters for processing by processor 1102. The information is transferred to processor 1102 via bus 1108. EDA system 1100 is configured to receive information related to a UI through I/O interface 1110. The information is stored in computer-readable medium 1104 as user interface (UI) 1152.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 12:
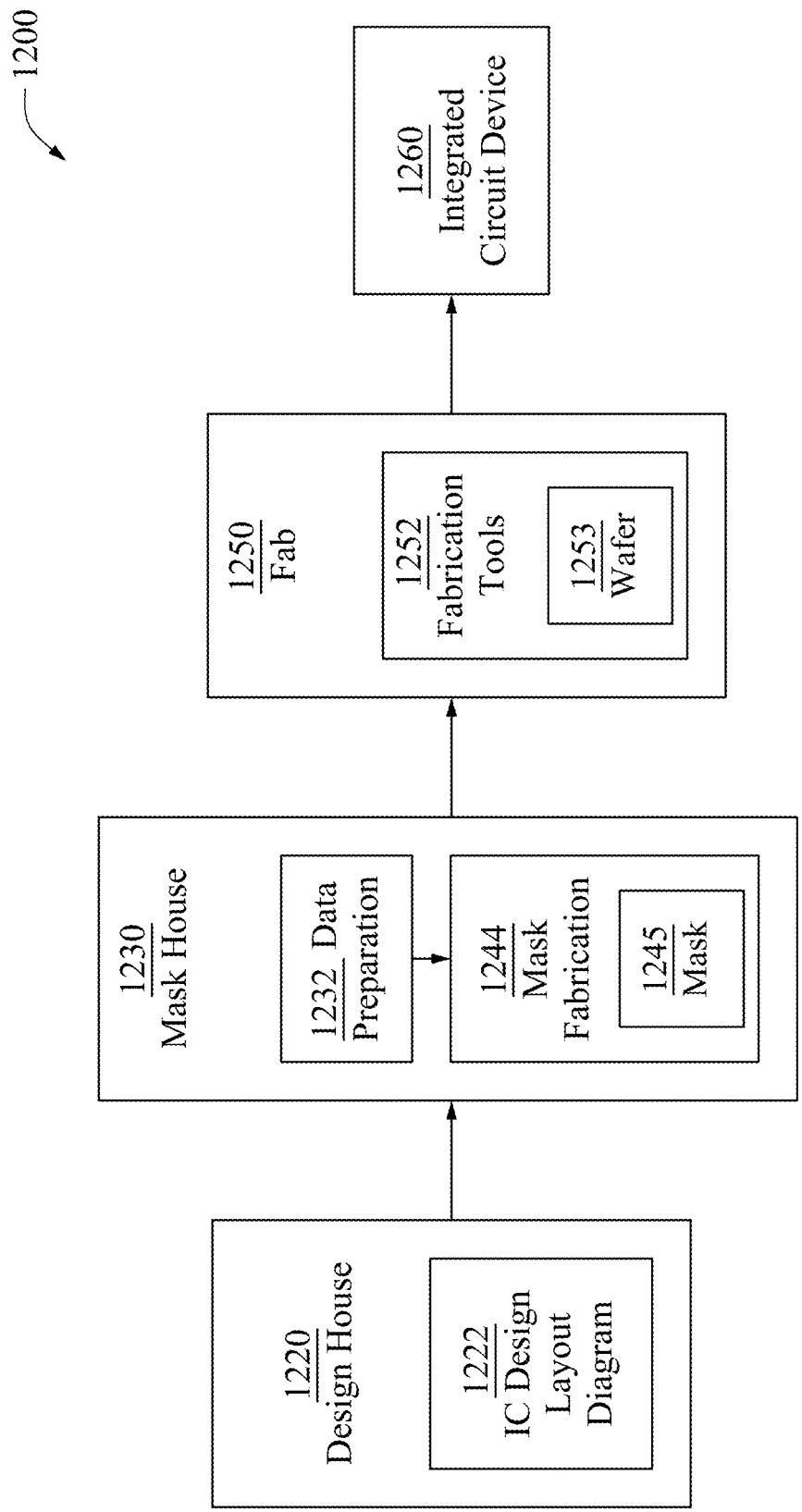
FIG. 12 is a block diagram of an integrated circuit (IC) manufacturing system, and an IC manufacturing flow associated therewith, in accordance with some embodiments.

FIG. 12 is a block diagram of an integrated circuit (IC) manufacturing system 1200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1200.

In FIG. 12, IC manufacturing system 1200 includes entities, such as a design house 1220, a mask house 1230, and an IC manufacturer/fabricator ("fab") 1250, that interact with one another in the design, development, and manufacturing cycles and/or services related to manufacturing an IC device 1260. The entities in manufacturing system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1250 is owned by a single larger company. In some embodiments, two or more of design house 1220, mask house 1230, and IC fab 1250 coexist in a common facility and use common resources.

Design house (or design team) 1220 generates an IC design layout diagram 1222. IC design layout diagram 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout diagram 1222 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout diagram 1222. The design procedure includes one or more of logic design, physical design or place and route. IC design layout diagram 1222 is presented in one or more data files having information of the geometrical patterns. For example, IC design layout diagram 1222 can be expressed in a GDSII file format or DFII file format.

Mask house 1230 includes data preparation 1232 and mask fabrication 1244. Mask house 1230 uses IC design layout diagram 1222 to manufacture one or more masks 1245 (or, reticle, or photomask) to be used for fabricating the various layers of IC device 1260 according to IC design layout diagram 1222. Mask house 1230 performs mask data preparation 1232, where IC design layout diagram 1222 is translated into a representative data file ("RDF"). Mask data preparation 1232 provides the RDF to mask fabrication 1244. Mask fabrication 1244 includes a mask writer. A mask writer converts the RDF to an image on a substrate, such as a mask 1245 or a semiconductor wafer 1253. The design layout diagram 1222 is manipulated by mask data preparation 1232 to comply with particular characteristics of the mask writer and/or requirements of IC fab 1250. In FIG. 12, mask data preparation 1232 and mask fabrication 1244 are illustrated as separate elements. In some embodiments, mask data preparation 1232 and mask fabrication 1244 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout diagram 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout diagram 1222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1222 to compensate for limitations during mask fabrication 1244, which may undo part of the modifications performed by OPC in order to meet mask creation rules.

In some embodiments, mask data preparation 1232 includes lithography process checking (LPC) that simulates processing that will be implemented by IC fab 1250 to fabricate IC device 1260. LPC simulates this processing based on IC design layout diagram 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1222.

It should be understood that the above description of mask data preparation 1232 has been simplified for the purposes of clarity. In some embodiments, data preparation 1232 includes additional features such as a logic operation (LOP) to modify the IC design layout diagram 1222 according to manufacturing rules. Additionally, the processes applied to IC design layout diagram 1222 during data preparation 1232 may be executed in a variety of different orders.

After mask data preparation 1232 and during mask fabrication 1244, a mask 1245 or a group of masks 1245 are fabricated based on the modified IC design layout diagram 1222. In some embodiments, mask fabrication 1244 includes performing one or more lithographic exposures based on IC design layout diagram 1222. In some embodiments, an electron-beam (e-beam) or a mechanism of multiple e-beams is used to form a pattern on a mask (photomask or reticle) 1245 based on the modified IC design layout diagram 1222. Mask 1245 can be formed in various technologies. In some embodiments, mask 1245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1245 includes a transparent substrate (e.g., fused quartz) and an opaque material (e.g., chromium) coated in the opaque regions of the binary mask. In another example, mask 1245 is formed using a phase shift technology. In a phase shift mask (PSM) version of mask 1245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1244 is used in a variety of processes. For example, such a mask(s) is used in an ion implantation process to form various doped regions in semiconductor wafer 1253, in an etching process to form various etching regions in semiconductor wafer 1253, and/or in other suitable processes.

IC fab 1250 includes fabrication tools 1252. IC fab 1250 is an IC fabrication business that includes one or more manufacturing facilities for the fabrication of a variety of different IC products. In some embodiments, IC Fab 1250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1250 uses mask(s) 1245 fabricated by mask house 1230 to fabricate IC device 1260. Thus, IC fab 1250 at least indirectly uses IC design layout diagram 1222 to fabricate IC device 1260. In some embodiments, semiconductor wafer 1253 is fabricated by IC fab 1250 using mask(s) 1245 to form IC device 1260. In some embodiments, the IC fabrication includes performing one or more lithographic exposures based at least indirectly on IC design layout diagram 1222. Semiconductor wafer 1253 includes a silicon substrate or other proper substrate having material layers formed thereon. Semiconductor wafer 1253 further includes one or more of various doped regions, dielectric features, multi-level interconnects, and the like (formed at subsequent manufacturing steps).

Details regarding an integrated circuit (IC) manufacturing system (e.g., manufacturing system 1200 of FIG. 12), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

Aspects of the present disclosure relate to an integrated circuit structure which includes a first transistor comprising a first gate electrode, a first source, a first source conductive line over the first source, a first drain, and a first drain conductive line over the first drain; a second transistor comprising a second gate electrode, a second drain, the first source, and a second drain conductive line over the second drain; a bit line electrically connecting the first drain conductive line to the second drain conductive line; and a first trench isolation structure between the first source and the second drain and which electrically isolates the first source from the second drain. In some embodiments, the first gate electrode and the second gate electrode are separated by one gate electrode separation interval. In some embodiments, the first drain and the second drain are separated by two conductive line separation intervals. In some embodiments, the integrated circuit structure includes a power rail, wherein the first source conductive line and the second source conductive line are electrically connected to the power rail. In some embodiments, the integrated circuit structure includes a third gate electrode, a second source, a source conductive line electrically connecting the first source conductive line to the second source conductive line, and a third drain with a third drain conductive line, wherein the third gate electrode is between the third drain and the second source. In some embodiments, the integrated circuit structure includes a third transistor with a third drain, a third gate electrode, and the second drain, wherein the second drain of the second transistor is configured to provide a bit value for the third transistor.

Aspects of the present disclosure relate to an integrated circuit structure, which includes a first drain contact; a drain conductive line connected to the first drain contact; where a first transistor includes a first gate electrode, a first gate electrode contact, a first source, a first source conductive line electrically connected to the first source, a first source contact electrically connected to the first source conductive line, a first drain electrically connected to the drain conductive line, a power rail electrically connected to the first source contact and a first gate electrode tie-off contact, wherein the first gate electrode tie-off contact electrically connects the power rail to the first gate electrode; and a second transistor includes a second gate electrode, a second gate electrode contact connected to the second gate electrode, a second source, a second source conductive line connected to the second source, a second source contact connected to the second source conductive line and the power rail, and a second drain electrically connected to the drain conductive line. In some embodiments, the integrated circuit structure of claim 7, further comprising a second gate electrode tie-off contact electrically connected to the second gate electrode and the power rail. In some embodiments, the first gate electrode is a first gate electrode separation interval from the second gate electrode, and wherein the first source conductive line is separated from the second source conductive line by two conductive line intervals. In some embodiments, the integrated circuit structure includes a bit line electrically connected to the first drain contact. In some embodiments, the integrated circuit structure includes a third ROM transistor having a third gate electrode, a third gate electrode contact, a third drain, a second drain conductive line, and a second drain contact, wherein the second drain contact is electrically connected to the bit line, and wherein the third gate electrode is separated from the first gate electrode by one gate electrode separation interval, and the second gate electrode is separated from the third gate electrode by two gate electrode separation intervals.

Aspects of the present disclosure relate to a method of making an integrated circuit read only memory (ROM) structure, which includes operations of forming a ROM transistor by implanting an active area having a channel, a source region, and a drain region, depositing a gate electrode over the channel, depositing a conductive line over at least one of the source region and the drain region, adding dopants to the source region and the drain region of the active area; forming contacts against the gate electrode, the source region, and the drain region; depositing a power rail, a bit line, and at least one word line of the integrated circuit against the contacts; and dividing the active area with a trench isolation structure to electrically isolate the gate electrode from the source region and the drain region. In some embodiments, dividing the active area with a trench isolation structure to electrically isolate the gate electrode from the source region and the drain region includes depositing a layer of patterning material over at least one gate electrode; developing the layer of patterning material to expose the at least one gate electrode through an opening in the layer of patterning material; etching an opening through the gate electrode to expose the channel; and filling the opening with a dielectric material. In some embodiment, the method includes exposing a material below the channel, wherein filling the opening with the dielectric material includes depositing the dielectric material one the exposed material. In some embodiments, forming the trench isolation structure includes dividing the gate electrode into multiple portions using an etching process. In some embodiments, configuring the ROM transistor includes forming a gate electrode tie-off contact configured to electrically connect the gate electrode to a power rail, and forming the gate electrode tie-off contact occurs during the forming contacts against the gate electrode, the source region, and the drain region. In some embodiments, the method includes depositing an inter-layer dielectric (ILD) over the conductive line and the gate electrode; etching a first opening through the ILD to expose a first source contact; etching a second opening through the ILD to expose a first drain contact; etching a third opening through the ILD to expose a gate electrode contact; filling the first opening through the ILD to make a power rail; filling the second opening to form a bit line; and filling the third opening to form a word line. In some embodiments, etching the first opening includes exposing a second source contact, and filling the first opening includes making a power rail which electrically connects the first source contact to the second contact. In some embodiments, the method includes etching a first opening through the gate electrode; and filling the opening with a dielectric material. In some embodiments, etching a first opening through the gate electrode includes exposing a substrate below the gate electrode, and filling the opening with a dielectric material includes depositing a dielectric material against the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit read-only memory (ROM) structure, comprising:
   a first transistor comprising a first gate electrode, a first source, a first source conductive line over the first source, a first drain, and a first drain conductive line over the first drain;
   a second transistor comprising a second gate electrode, a second drain, the first source, and a second drain conductive line over the second drain;
   a bit line electrically connecting the first drain conductive line to the second drain conductive line; and
   a first trench isolation structure between the first source and the second drain and which electrically isolates the first source from the second drain,
   wherein the first drain and the second drain are separated by two conductive line separation intervals.

2. The integrated circuit ROM structure of claim 1, wherein the first gate electrode and the second gate electrode are separated by one gate electrode separation interval.

3. The integrated circuit ROM structure of claim 1, further comprising a power rail, wherein the first source conductive line and a second source conductive line are electrically connected to the power rail.

4. The integrated circuit ROM structure of claim 1, further comprising a third gate electrode, a second source, a source conductive line electrically connecting the first source conductive line to a second source conductive line, and a third drain with a third drain conductive line, wherein the third gate electrode is between the third drain and the second source.

5. The integrated circuit ROM structure of claim 4, further comprising a third transistor with the third drain, the third gate electrode, and the second drain, wherein the second drain of the second transistor is configured to provide a bit value for the third transistor.

6. An integrated circuit read-only memory (ROM) structure, comprising:
   a first transistor comprising:
      a first gate electrode,
      a first gate electrode contact electrically connected to the first gate electrode,
      a first source,
      a first source conductive line electrically connected to the first source,
      a first source contact electrically connected to the first source conductive line, and
      a first drain; and
   a power rail electrically connected to the first source contact and a first gate electrode tie-off contact, wherein the first gate electrode tie-off contact electrically connects the power rail to the first gate electrode;
   a second transistor comprising:
      a second gate electrode,
      a second gate electrode contact electrically connected to the second gate electrode,
      a second source,
      a second source conductive line electrically connected to the second source,
      a second source contact electrically connected to the second source conductive line and the power rail, and
      the first drain; and
   a third transistor comprising:

a third gate electrode,
the first source, and
a second drain,
wherein the third gate electrode is separated from the first gate electrode by one gate electrode separation interval, and the second gate electrode is separated from the third gate electrode by two gate electrode separation intervals.

7. The integrated circuit ROM structure of claim 6, further comprising a second gate electrode tie-off contact electrically connected to the second gate electrode and the power rail.

8. The integrated circuit ROM structure of claim 6, wherein the first source conductive line is separated from the second source conductive line by two conductive line intervals.

9. The integrated circuit ROM structure of claim 6, further comprising:
a first drain conductive line electrically connected to the first drain;
a second drain conductive line electrically connected to the second drain;
a bit line;
a first drain contact electrically connecting the bit line to the first drain conductive line; and
a second drain contact electrically connecting the bit line to the second drain conductive line.

10. The integrated circuit ROM structure of claim 9, further comprising a third gate electrode contact electrically connected to the third gate electrode.

11. An integrated circuit read-only memory (ROM) structure, comprising:
a first drain contact;
a drain conductive line electrically connected to the first drain contact;
a first transistor comprising:
  a first gate electrode,
  a first gate electrode contact,
  a first source,
  a first source conductive line electrically connected to the first source,
  a first source contact electrically connected to the first source conductive line,
  a first drain electrically connected to the drain conductive line, and
  a power rail electrically connected to the first source contact; and
a second transistor comprising:
  a second gate electrode, the second gate electrode comprising a first portion and a second portion, the first portion and the second portion being separated by an isolation structure,
  a second gate electrode contact connected to the isolation structure,
  a second source,
  a second source conductive line connected to the second source,
  a second source contact connected to the second source conductive line and the power rail, and
  a second drain electrically connected to the drain conductive line.

12. An integrated circuit ROM structure according to claim 11, wherein:
the isolation structure extends across an active area.

13. An integrated circuit ROM structure according to claim 12, wherein:
the first portion of the second gate electrode is on a first side of the active area; and
the second portion of the second gate electrode is on a second side of the active area opposite the first side.

14. An integrated circuit ROM structure according to claim 12, further comprising:
a bit line;
a first word line; and
a second word line, wherein the bit line, first word line, and second word line are parallel to the power rail.

15. An integrated circuit ROM structure according to claim 14, wherein:
the bit line is electrically connected to the first drain contact;
the first word line is electrically connected to the first gate electrode contact; and
the second word line is electrically connected to the second gate electrode contact.

16. An integrated circuit ROM structure according to claim 15, wherein:
the first word line comprises a first word line first portion and a first word line second portion, wherein the first word line second portion is electrically connected to the first gate electrode contact; and
the second word line comprises a second word line first portion and a second word line second portion, wherein the second word line first portion is electrically connected to the second gate electrode contact.

17. An integrated circuit ROM structure according to claim 14, further comprising:
a third transistor comprising:
  a third gate electrode, the third gate electrode comprising a first portion and a second portion, the first portion of the third gate electrode and the second portion of the third gate electrode being separated by a further isolation structure,
  a third gate electrode contact connected to the further isolation structure,
  a third source,
  a third source conductive line connected to the third source,
  a third source contact connected to the third source conductive line and the power rail, and
  a third drain electrically connected to the drain conductive line.

18. An integrated circuit ROM structure according to claim 17, wherein:
the bit line is electrically connected to the first drain contact;
the first word line is electrically connected to the first gate electrode contact; and
the second word line is electrically connected to the second gate electrode contact and the third gate electrode contact.

19. An integrated circuit ROM structure according to claim 18, wherein:
the first gate electrode is between the second gate electrode and the third gate electrode.

20. An integrated circuit ROM structure according to claim 12, further comprising:
a bit line electrically connected to the first drain and the second drain,
wherein
the first gate electrode extends continuously across the active area,
upon reading the first transistor, the first transistor is configured to produce a first bit value, and upon reading the second transistor, the second transistor is configured to produce a second bit value different from the first bit value.

\* \* \* \* \*